United States Patent
Kishioka et al.

(10) Patent No.: US 11,319,514 B2
(45) Date of Patent: May 3, 2022

(54) COMPOSITION FOR FORMING A COATING FILM FOR REMOVING FOREIGN MATTERS

(71) Applicant: NISSAN CHEMICAL CORPORATION, Tokyo (JP)

(72) Inventors: Takahiro Kishioka, Toyama (JP); Mamoru Tamura, Toyama (JP); Yuki Usui, Toyama (JP); Hiroto Ogata, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 146 days.

(21) Appl. No.: 16/490,843

(22) PCT Filed: Feb. 28, 2018

(86) PCT No.: PCT/JP2018/007471
§ 371 (c)(1),
(2) Date: Oct. 29, 2019

(87) PCT Pub. No.: WO2018/159665
PCT Pub. Date: Sep. 7, 2018

(65) Prior Publication Data
US 2020/0140792 A1  May 7, 2020

(30) Foreign Application Priority Data
Mar. 3, 2017 (JP) .............. JP2017-040803

(51) Int. Cl.
| | | |
|---|---|---|
| B32B 43/00 | (2006.01) |
| C11D 11/00 | (2006.01) |
| B08B 7/00 | (2006.01) |
| C08G 73/10 | (2006.01) |
| C09J 5/00 | (2006.01) |
| C09J 179/08 | (2006.01) |
| C11D 7/32 | (2006.01) |
| H01L 21/02 | (2006.01) |
| H01L 21/683 | (2006.01) |
| B32B 38/10 | (2006.01) |

(52) U.S. Cl.
CPC ........ C11D 11/0058 (2013.01); B08B 7/0014 (2013.01); C08G 73/1032 (2013.01); C08G 73/1042 (2013.01); C08G 73/1057 (2013.01); C08G 73/1067 (2013.01); C09J 5/00 (2013.01); C09J 179/08 (2013.01); C11D 7/3263 (2013.01); C11D 11/0047 (2013.01); H01L 21/02079 (2013.01); H01L 21/6836 (2013.01); B32B 38/10 (2013.01); B32B 43/006 (2013.01); C09J 2301/502 (2020.08); C09J 2479/08 (2013.01); H01L 2221/68327 (2013.01); H01L 2221/68386 (2013.01); Y10S 156/93 (2013.01); Y10T 156/1111 (2015.01)

(58) Field of Classification Search
CPC .. B32B 38/10; B32B 43/006; Y10T 156/1111; Y10S 156/93; Y10S 156/931; Y10S 156/941
See application file for complete search history.

(56) References Cited

U.S. PATENT DOCUMENTS

| | | | |
|---|---|---|---|
| 7,598,182 B2 | 10/2009 | Hatanaka et al. | |
| 8,771,496 B2 * | 7/2014 | Nagata | B32B 27/28 205/184 |
| 2015/0092147 A1 * | 4/2015 | Tokuhisa | G02F 1/133788 349/123 |
| 2015/0177567 A1 * | 6/2015 | Chiou | G02F 1/133723 524/600 |
| 2017/0233530 A1 * | 8/2017 | Akinaga | H05K 1/036 428/216 |
| 2018/0051136 A1 * | 2/2018 | Koyama | G03F 7/031 |

FOREIGN PATENT DOCUMENTS

| | | |
|---|---|---|
| JP | 2008-532313 A | 8/2008 |
| JP | 2009-141009 A | 6/2009 |
| WO | 2005/022261 A1 | 3/2005 |
| WO | 2006/093639 A1 | 9/2006 |
| WO | 2015/053132 A1 | 4/2015 |

OTHER PUBLICATIONS

Specification translation of Lee et al. WO 2015/053132 (Year: 2015).*
May 22, 2018 International Search Report issued in International Patent Application No. PCT/JP2018/007471.
Sep. 3, 2019 International Preliminary Report on Patentability issued in International Patent Application No. PCT/JP2018/007471.

* cited by examiner

*Primary Examiner* — Philip C Tucker
*Assistant Examiner* — Nickolas R Harm
(74) *Attorney, Agent, or Firm* — Oliff PLC

(57) ABSTRACT

A simplified method for removing foreign matters formed on a substrate in a semiconductor device manufacturing process; and a composition for forming a coating film for foreign matter removal use, which can be used in the method. A coating film is formed on a semiconductor substrate using a composition preferably containing a polyamic acid produced from (a) a tetracarboxylic dianhydride compound and (b) a diamine compound having at least one carboxyl group or a polyamic acid produced from (a) a tetracarboxylic dianhydride compound, (b) a diamine compound having at least one carboxyl group and (c) a diamine compound, and then foreign matters occurring on the coating film are removed together with the coating film by the treatment with a developing solution.

14 Claims, No Drawings

COMPOSITION FOR FORMING A COATING FILM FOR REMOVING FOREIGN MATTERS

TECHNICAL FIELD

The present invention relates to a composition for forming a coating film for removing foreign matters, a method for removing foreign matters on a substrate, a method for treating a substrate, and a method for producing a laminated substrate, which are advantageous in that foreign matters formed on a substrate can be removed by a simple and easy method. The present invention relates to a composition for forming a coating film for removing foreign matters, which is preferably used in the semiconductor wafer temporarily bonding step in the production of a semiconductor device.

BACKGROUND ART

In the production of a semiconductor device, particularly, with respect to the so-called post-step, studies are being made on the process in which a semiconductor substrate (wafer) is bonded to a supporting substrate, and then subjected to, e.g., back-grinding (grinding) and wiring formation steps, and subsequently the supporting substrate is peeled off to obtain a desired semiconductor substrate.

When bonding a wafer to a supporting substrate, the wafer is bonded using a bonding agent (such as a liquid composition containing a polymer, a back-grinding tape, or a dicing tape) having a resistance to the subsequent steps (heating step and chemical treatment step), and then the step of peeling the semiconductor substrate off is performed. In this instance, the bonding layer included in the bonding agent likely remains on the substrate as foreign matters (residue). Such a phenomenon remarkably occurs especially when a bonding layer is formed directly on the surface of a semiconductor substrate having wiring and others previously formed on a substrate.

There are some cases in which the foreign matters cannot be completely removed even when, for example, cleaning is conducted using, e.g., a known organic solvent or liquid chemical agent.

A method in which a supporting substrate and a semiconductor wafer are bonded using a bonding composition, the back surface of the semiconductor wafer is polished, and then the bonding agent is removed using an etching liquid is disclosed (Patent Literature 1).

With respect to antireflection films for use in semiconductor lithography, an antireflection film, which is soluble in a developer for a photoresist, and can be removed simultaneously with the photoresist during the development, is disclosed (Patent Literature 2).

CITATION LIST

Patent Literature

Patent Literature 1: JP 2008-532313 A
Patent Literature 2: WO 2005/022261 A1

SUMMARY OF INVENTION

Technical Problem

A problem to be solved by the present invention is to provide a simple and easy method for removing foreign matters formed on a substrate, for example, in the semiconductor wafer temporarily bonding step in the production of a semiconductor device, and is to provide a composition for forming a coating film for removing foreign matters used in such a method.

The application of the coating film for removing foreign matters of the present invention is not limited to the above-mentioned temporarily bonding step as long as the coating film is used for removing foreign matters on a substrate.

Solution to Problem

The present inventors have conducted extensive and intensive studies. As a result, they have found that complete removal of peeling residue after bonding without causing any damage to the substrate can be achieved by preliminarily applying the coating for removing foreign matters to the bonding surface of a substrate, baking it to form a coating film, then subjecting the resultant substrate to bonding step, wafer temporarily bonding step, and wafer peeling step, and then cleaning the substrate using a developer. Thus, the present invention has been accomplished.

The present invention embraces the followings.

[1] A composition for forming a coating film for removing foreign matters, comprising a polymer and a solvent, and being capable of forming a coating film that is soluble in a developer.

[2] The composition according to item [1], wherein the polymer is a polyamic acid having a structural unit derived from (a) a tetracarboxylic dianhydride compound and (b) a diamine compound having at least one carboxyl group.

[3] The composition according to item [1], wherein the polymer is a polyamic acid having
a structural unit derived from (a) a tetracarboxylic dianhydride compound and (b) a diamine compound having at least one carboxyl group, and
a structural unit derived from the (a) tetracarboxylic dianhydride compound and (c) a diamine compound different from the diamine compound (b).

[4] The composition according to item [3], wherein the diamine compound (c) is a diamine compound having no carboxyl group.

[5] A coating film for removing foreign matters, which is a baked material of an applied film formed from the composition according to any one of items [1] to [4].

[6] A method for removing foreign matters, comprising the steps of:
applying the composition according to any one of items [1] to [4] onto a substrate and baking the applied composition to form a coating film;
allowing foreign matters to form on the coating film; and
removing the coating film together with the foreign matters using a developer.

[7] The method according to item [6], wherein the step of allowing foreign matters to form includes the step of forming a bonding layer on the coating film, and the step of peeling the bonding layer off thereafter.

[8] The method according to item [7], wherein the foreign matters are a peeling residue of the bonding layer.

[9] A method for treating a substrate, comprising the steps of:
applying the composition according to any one of items [1] to [4] onto a first substrate and baking the applied composition to form a coating film;
forming a bonding layer on the coating film;
temporarily bonding a second substrate to the first substrate through the bonding layer;
peeling the second substrate off from the first substrate; and
removing the coating film remaining on the first substrate after the peeling of the second substrate, together with the bonding layer, using a developer.

[10] A method for producing a laminated substrate, comprising the steps of:
applying the composition according to any one of items [1] to [4] onto a first substrate and baking the applied composition to form a coating film;
forming a bonding layer on the coating film; and
bonding a second substrate to the first substrate.

[11] A composition for forming a coating film for removing foreign matters, comprising a polymer and a solvent, wherein the coating film is soluble in a developer.

[12] The composition according to item [11], wherein the polymer is a polymer comprising a polyamic acid having a structure represented by the following formula (1):

[Chemical formula 1]

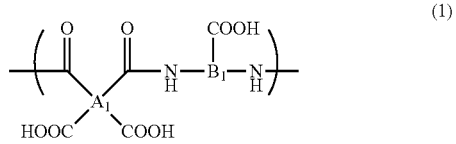

(1)

wherein $A_1$ represents a tetravalent organic group, and $B_1$ represents a trivalent organic group.

[13] The composition according to item [12], wherein the polymer further comprises a polyamic acid having a structure represented by the formula (1) above and a structure represented by the following formula (2):

[Chemical formula 2]

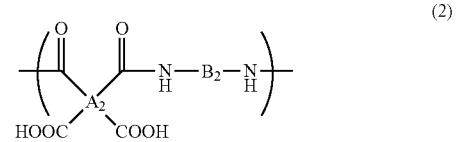

(2)

wherein $A_2$ represents a tetravalent organic group, and $B_2$ represents a divalent organic group.

[14] The composition according to item [12], wherein the polyamic acid is a polyamic acid produced from (a) a tetracarboxylic dianhydride compound and (b) a diamine compound having at least one carboxyl group.

[15] The composition according to item [13], wherein the polyamic acid is a polyamic acid produced from (a) a tetracarboxylic dianhydride compound, (b) a diamine compound having at least one carboxyl group, and (c) a diamine compound.

[16] The composition according to item [14] or [15], wherein the tetracarboxylic dianhydride compound (a) is a tetracarboxylic dianhydride compound having at least one benzene ring structure.

[17] The composition according to item [14] or [15], wherein the diamine compound having at least one carboxyl group (b) is a diamine compound having at least one benzene ring structure.

[18] The composition according to item [15], wherein the diamine compound (c) is a diamine compound having two benzene ring structures.

[19] The composition according to item [12] or [13], wherein the polyamic acid has a weight average molecular weight of 1,000 to 50,000.

[20] The composition according to item [12] or [13], further comprising a compound having at least two epoxy groups.

[21] A coating film for removing foreign matters, formed by applying the composition according to any one of items [11] to [20] onto a substrate and baking the applied composition.

[22] A method for removing foreign matters, comprising the steps of:
applying the composition according to any one of items [11] to [20] onto a substrate and baking the applied composition to form a coating film;
allowing foreign matters to form on the coating film; and
removing the coating film using a developer.

[23] The method according to item [22], which further comprises, after the step of forming the coating film, the step of forming a bonding layer and peeling the bonding layer off thereafter.

[24] The method according to item [22], wherein the foreign matters are a peeling residue after forming the bonding layer.

[25] A method for treating a substrate, comprising the steps of:
applying the composition according to any one of items [11] to [20] onto a substrate and baking the applied composition to form a coating film;
forming a bonding layer on the film;
temporarily bonding another substrate to the substrate;
peeling the another substrate off; and
removing the film using a developer.

[26] A method for producing a laminated substrate, comprising the steps of:
applying the composition according to any one of items [11] to [20] onto a substrate and baking the applied composition to form a coating film;
forming a bonding layer on the film; and
bonding another substrate to the substrate.

Advantageous Effects of Invention

Particularly, in the wafer temporarily bonding step for semiconductor wafer, the coating film for removing foreign matters (foreign-matter removing coating film) of the present invention is preliminarily formed on a substrate (substrate for processing), the substrate is bonded to a supporting substrate using a bonding layer, then the supporting substrate is peeled off from the substrate in the wafer peeling step, and then the substrate is subjected to cleaning using a developer, so that both the foreign-matter removing coating film of the present invention and the foreign matters on the foreign-matter removing coating film can be simultaneously completely removed. This markedly reduces defective products caused due to foreign matters in the semiconductor device production, and contributes to an improvement of the yield of high quality wafers.

Particularly, when used in the semiconductor wafer temporarily bonding step, the foreign-matter removing coating film of the present invention has a resistance to the semiconductor substrate processing process (by heat and chemicals) subsequent to the wafer temporarily bonding.

DESCRIPTION OF EMBODIMENTS

<Composition for Forming a Coating Film for Removing Foreign Matters>

The composition for forming a coating film for removing foreign matters of the present invention comprises a polymer soluble in a developer. There is no particular limitation to the polymer as long as it is soluble in a developer. However, when it is used in the semiconductor wafer temporarily bonding step, the polymer is preferably a polymer having a resistance to the semiconductor substrate processing process (by heat and chemicals) subsequent to the wafer temporarily bonding. Specific examples of the polymers include a polyamic acid, a vinyl polymerization polymer formed by a reaction of an olefin, a polyamide, a polyester, a polycarbonate, and a polyurethane. The composition preferably comprises a solvent and a polyamic acid having a structure represented by the formula (1). Preferably, it further comprises a compound having at least two epoxy groups. The foreign-matter removing coating film forming composition of the present invention comprises a solvent and a polyamic acid having a structure represented by the formula (1) and a structure represented by the formula (2). Preferably, it further comprises a compound having at least two epoxy groups. The foreign-matter removing coating film forming composition of the present invention contains, as an optional component, a light absorbing compound and a surfactant, for example.

There is no particular limitation to the solid content of the foreign-matter removing coating film forming composition of the present invention as long as the components are uniformly dissolved. However, for example, the solid content of the composition ranges from 0.5 to 50% by mass, or, for example, 1 to 30% by mass. The "solid" means a component left behind the subtraction of the solvent component from the total components of the foreign-matter removing coating film forming composition.

In the present invention, the foreign matters mean materials that are deposited on the substrate but other than the intended material. In the semiconductor device production process, the foreign matters are unnecessary materials. For example, they include particles deposited on the wafer, metal impurities, etching residues, and bonding agent peeling residues.

The foreign-matter removing coating film of the present invention is especially preferably used, during the process of bonding wafers using a bonding agent followed by peeling the bonding agent off, for forming the coating film of the present invention before applying the bonding agent, conducting thereafter wafer bonding and peeling steps, and then removing the foreign matters (bonding agent residue).

The expression that the foreign-matter removing coating film of the present invention is soluble in a developer means that, when the coating film is, for example, immersed in or cleaned using the below-mentioned developer, the coating film is dissolved in the developer so that it is not present on the substrate. The term "dissolved (or dissolution)" in the present invention means:
at least 90% or more of the thickness of the film originally formed is removed (that is, the thickness of the residual film is 10% or less of the thickness of the original film); or
at least 95% or more of the thickness of the original film is removed (that is, the thickness of the residual film is 5% or less of the thickness of the original film); or
at least 99% or more of the thickness of the original film is removed (that is, the thickness of the residual film is 1% or less of the thickness of the original film);
most preferably 100% of the thickness of the original film is removed (that is, the thickness of the residual film is 0% of the thickness of the original film (no residual film remains)); by the method described in the Examples below from the film formed on the substrate.

The foreign-matter removing coating film forming composition of the present invention is described in detail.
<Polyamic Acid>

The foreign-matter removing coating film forming composition of the present invention comprises a polyamic acid having a structure represented by the formula (1), or a polyamic acid having a structure represented by the formula (1) and a structure represented by the formula (2).

In the formula (1), $A_1$ represents a tetravalent organic group, and $B_1$ represents a trivalent organic group. For example, $A_1$ includes the formulae (3) to (10) (wherein X represents an alkyl group having 1 to 5 carbon atoms, a chlorine atom, a bromine atom, a fluorine atom, an alkoxy group having 1 to 5 carbon atoms, a hydroxyl group, a carboxyl group, a phenoxy group, a trifluoromethyl group, or a nitro group, and m represents a number of 0, 1, or 2).

[Chemical formula 3]

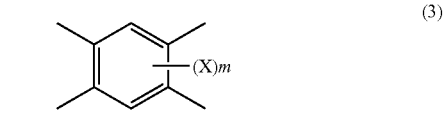
(3)

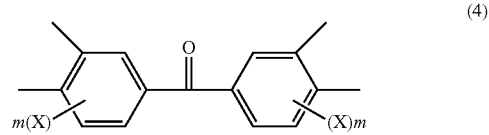
(4)

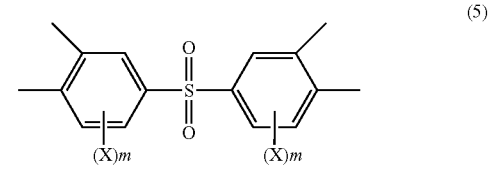
(5)

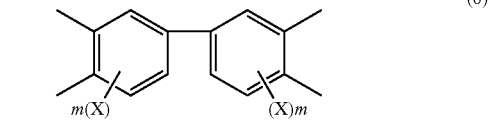
(6)

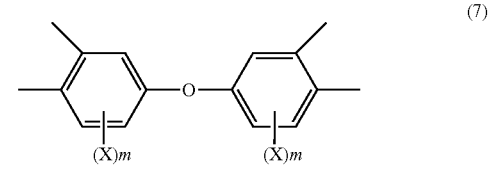
(7)

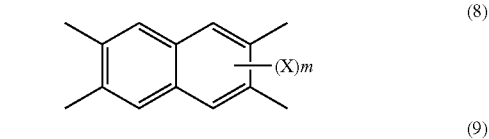
(8)

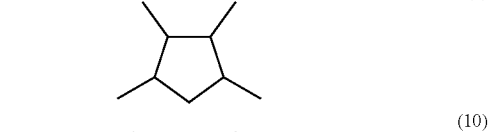
(9)

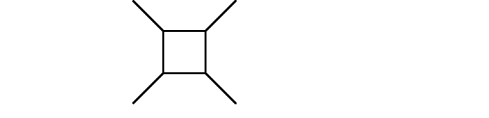
(10)

For example, $B_1$ includes the formulae (11) to (18) (wherein Y represents an alkyl group having 1 to 5 carbon atoms, a chlorine atom, a bromine atom, a fluorine atom, an alkoxy group having 1 to 5 carbon atoms, a hydroxyl group, a carboxyl group, a phenoxy group, a trifluoromethyl group, or a nitro group, and m represents a number of 0, 1, or 2).

[Chemical formula 4]

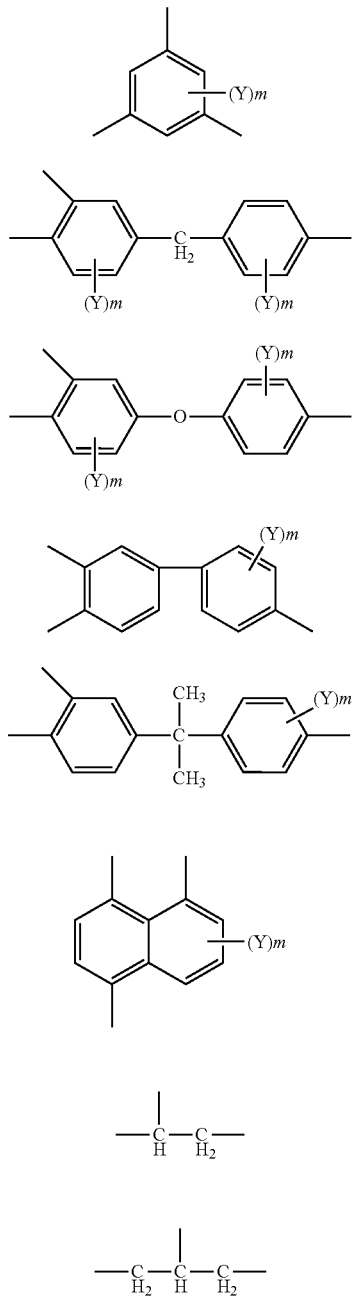

(11)
(12)
(13)
(14)
(15)
(16)
(17)
(18)

In the formula (2), $A_2$ represents a tetravalent organic group, and $B_2$ represents a divalent organic group. For example, $A_2$ includes the formulae (3) to (10).

For example, $B_2$ includes the formulae (19) to (27) (wherein Z represents an alkyl group having 1 to 5 carbon atoms, a chlorine atom, a bromine atom, a fluorine atom, an alkoxy group having 1 to 5 carbon atoms, a hydroxyl group, a carboxyl group, a phenoxy group, a trifluoromethyl group, or a nitro group, and m represents a number of 0, 1, or 2).

[Chemical formula 5]

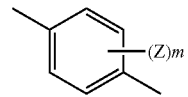

(19)

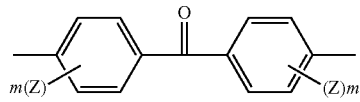

(20)

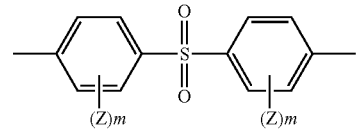

(21)

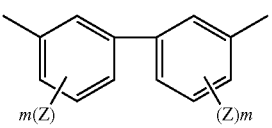

(22)

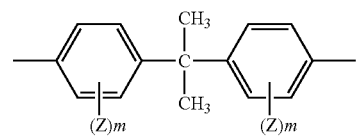

(23)

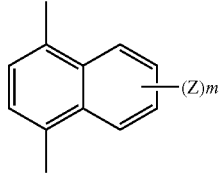

(24)

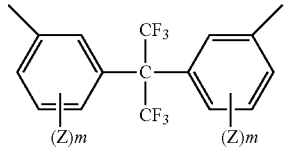

(25)

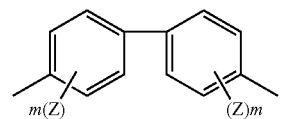

(26)

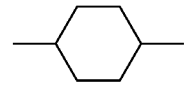

(27)

(28)

The polyamic acid used in the present invention has a weight average molecular weight of, for example, 1,000 to 100,000, or 1,000 to 50,000, preferably 2,000 to 50,000, in terms of a molecular weight determined using a conversion calibration curve obtained from the polystyrene. When the weight average molecular weight of the polyamic acid is 1,000 or less, increase of the solubility of the formed foreign-matter removing coating film in the solvent used in the bonding agent layer is sometimes occurred, which would cause intermixing (mixing of layers) of the coating film with the bonding agent layer. When the weight average molecular weight of the polyamic acid is 100,000 or more, the solubility of the formed foreign-matter removing coating film in a developer sometimes becomes insufficient, so that a residue would remain after the development.

There is no particular limitation to the method for obtaining the polyamic acid contained in the foreign-matter removing coating film forming composition of the present invention. The polyamic acid can be produced by any of the known methods. For example, the polyamic acid may be produced by subjecting a diamine compound and a tetracarboxylic acid or a derivative thereof, such as a tetracarboxylic dianhydride compound, or a dicarboxylic acid dihalide, to reaction and polymerization. Alternatively, the polyamic acid may be produced by synthesizing a polyamic acid silyl ester by polymerization using a bissilylated diamine compound and a tetracarboxylic dianhydride compound, and then decomposing the silyl ester portion using an acid.

The polyamic acid contained in the foreign-matter removing coating film forming composition of the present invention may be produced from (a) a tetracarboxylic dianhydride compound and (b) a diamine compound having at least one carboxyl group, or may be produced from (a) a tetracarboxylic dianhydride compound, (b) a diamine compound having at least one carboxyl group, and (c) a diamine compound.

There is no particular limitation to the tetracarboxylic dianhydride compound (a) used in the production of the polyamic acid used in the present invention. One type of the compound may be used alone, or two or more types of the compounds may be used in combination. Specific examples of compounds (a) include aromatic tetracarboxylic acids, such as pyromellitic dianhydride, 3,3'-,4,4'-biphenyltetracarboxylic dianhydride, 3,3'-,4,4'-benzophenonetetracarboxylic dianhydride, 3,3'-,4,4'-diphenyl ether tetracarboxylic dianhydride, and 3,3'-,4,4'-diphenyl sulfone tetracarboxylic dianhydride; alicyclic tetracarboxylic dianhydrides, such as 1,2,3,4-cyclobutanetetracarboxylic dianhydride, 1,2-dimethyl-1,2,3,4-cyclobutanetetracarboxylic dianhydride, 1,2,3,4-tetramethyl-1,2,3,4-cyclobutanetetracarboxylic dianhydride, 1,2,3,4-cyclopentanetetracarboxylic dianhydride, 1,2,3,4-cyclohexanetetracarboxylic dianhydride, and 3,4-dicarboxy-1,2,3,4-tetrahydro-1-naphthalenesuccinic dianhydride; and aliphatic tetracarboxylic dianhydrides, such as 1,2,3,4-butanetetracarboxylic dianhydride.

There is no particular limitation to the diamine compound (b) having at least one carboxyl group used in the production of the polyamic acid used in the present invention. One type of the compound may be used alone, or two or more types of the compounds may be used in combination. Specific examples of compounds (b) include 2,4-diaminobenzoic acid, 2,5-diaminobenzoic acid, 3,5-diaminobenzoic acid, 4,6-diamino-1,3-benzenedicarboxylic acid, 2,5-diamino-1,4-benzenedicarboxylic acid, bis(4-amino-3-carboxyphenyl) ether, bis(4-amino-3,5-dicarboxyphenyl) ether, bis(4-amino-3-carboxyphenyl) sulfone, bis(4-amino-3,5-dicarboxyphenyl) sulfone, 4,4'-diamino-3,3'-dicarboxybiphenyl, 4,4'-diamino-3,3'-dicarboxy-5,5'-dimethylbiphenyl, 4,4'-diamino-3,3'-dicarboxy-5,5'-dimethoxybiphenyl, 1,4-bis(4-amino-3-carboxyphenoxy)benzene, 1,3-bis(4-amino-3-carboxyphenoxy)benzene, bis[4-(4-amino-3-carboxyphenoxy)phenyl] sulfone, bis[4-(4-amino-3-carboxyphenoxy)phenyl]propane, and 2,2-bis[4-(4-amino-3-carboxyphenoxy)phenyl]hexafluoropropane.

There is no particular limitation to the diamine compound (c) used in the production of the polyamic acid used in the present invention, provided that diamine compound (c) is a diamine compound different from diamine compound (b) having at least one carboxyl group. Desirably, diamine compound (c) has no carboxyl group. One type of the compound may be used alone, or two or more types of the compounds may be used in combination. Specific examples of compounds (c) include diamine compounds having a phenolic hydroxyl group, such as 2,4-diaminophenol, 3,5-diaminophenol, 2,5-diaminophenol, 4,6-diaminoresorcinol, 2,5-diaminohydroquinone, bis(3-amino-4-hydroxyphenyl) ether, bis(4-amino-3-hydroxyphenyl) ether, bis(4-amino-3,5-dihydroxyphenyl) ether, bis(3-amino-4-hydroxyphenyl) methane, bis(4-amino-3-hydroxyphenyl)methane, bis(4-amino-3,5-dihydroxyphenyl)methane, bis(3-amino-4-hydroxyphenyl) sulfone, bis(4-amino-3-hydroxyphenyl) sulfone, bis(4-amino-3,5-dihydroxyphenyl) sulfone, 2,2-bis(3-amino-4-hydroxyphenyl)hexafluoropropane, 2,2-bis(4-amino-3-hydroxyphenyl)hexafluoropropane, 2,2-bis(4-amino-3,5-dihydroxyphenyl)hexafluoropropane, 4,4'-diamino-3,3'-dihydroxybiphenyl, 4,4'-diamino-3,3'-dihydroxy-5,5'-dimethylbiphenyl, 4,4'-diamino-3,3'-dihydroxy-5,5'-dimethoxybiphenyl, 1,4-bis(3-amino-4-hydroxyphenoxy)benzene, 1,3-bis(3-amino-4-hydroxyphenoxy)benzene, 1,4-bis(4-amino-3-hydroxyphenoxy)benzene, 1,3-bis(4-amino-3-hydroxyphenoxy)benzene, bis[4-(3-amino-4-hydroxyphenoxy)phenyl] sulfone, bis[4-(3-amino-4-hydroxyphenoxy)phenyl]propane, and 2,2-bis[4-(3-amino-4-hydroxyphenoxy)phenyl]hexafluoropropane; diamine compounds having a thiophenol group, such as 1,3-diamino-4-mercaptobenzene, 1,3-diamino-5-mercaptobenzene, 1,4-diamino-2-mercaptobenzene, bis(4-amino-3-mercaptophenyl) ether, and 2,2-bis(3-amino-4-mercaptophenyl)hexafluoropropane; and diamine compounds having a sulfonic group, such as 1,3-diaminobenzene-4-sulfonic acid, 1,3-diaminobenzene-5-sulfonic acid, 1,4-diaminobenzene-2-sulfonic acid, bis(4-aminobenzene-3-sulfonic acid) ether, 4,4'-diaminobiphenyl-3,3'-disulfonic acid, and 4,4'-diamino-3,3'-dimethylbiphenyl-6,6'-disulfonic acid. They also include diamine compounds, such as p-phenylenediamine, m-phenylenediamine, 4,4'-methylene-bis(2,6-ethylaniline), 4,4'-methylene-bis(2-isopropyl-6-methylaniline), 4,4'-methylene-bis(2,6-diisopropylaniline), 2,4,6-trimethyl-1,3-phenylenediamine, 2,3,5,6-tetramethyl-1,4-phenylenediamine, o-tolidine, m-tolidine, 3,3'-,5,5'-tetramethylbenzidine, bis[4-(3-aminophenoxy)phenyl] sulfone, 2,2-bis[4-(3-aminophenoxy)phenyl]propane, 2,2-bis[4-(3-aminophenoxy)phenyl]hexafluoropropane, 4,4'-diamino-3,3'-dimethyldicyclohexylmethane, 4,4'-diaminodiphenyl ether, 3,4-diaminodiphenyl ether, 4,4'-diaminodiphenylmethane, 3,4-diaminodiphenylmethane, 2,2-bis(4-anilino)hexafluoropropane, 2,2-bis(3-anilino)hexafluoropropane, 2,2-bis(3-amino-4-tolyl)hexafluoropropane, 1,4-bis(4-aminophenoxy)benzene, 1,3-bis(4-aminophenoxy)benzene, bis[4-(4-aminophenoxy)phenyl] sulfone, 2,2-bis[4-(4-aminophenoxy)phenyl]propane, and 2,2-bis[4-(4-aminophenoxy)phenyl]hexafluoropropane.

When diamine compound (b) having at least one carboxyl group and diamine compound (c) are used in the production of the polyamic acid used in the present invention, the proportion of diamine compound (b) having at least one carboxyl group in the all diamine compounds ranges, for example, 1 to 99% by mass, or, for example, 5 to 80% by mass, or 10 to 60% by mass. When the proportion of diamine compound (b) having at least one carboxyl group is smaller than the above value, the solubility of the formed foreign-matter removing coating film in a developer becomes insufficient.

When the polyamic acid used in the present invention is produced from tetracarboxylic dianhydride compound (a) and diamine compound (b) having at least one carboxyl group, or is produced from tetracarboxylic dianhydride compound (a), diamine compound (b) having at least one carboxyl group, and diamine compound (c), the ratio of the total molar number of the diamine compound(s) to the total molar number of the tetracarboxylic dianhydride compound ranges desirably from 0.8 to 1.2. Like in a general polycondensation reaction, as the molar ratio becomes close to 1, the degree of polymerization of the formed polyamic acid becomes larger, so that the molecular weight is increased.

In the production of the polyamic acid, the reaction temperature for the reaction of the diamine compound and the tetracarboxylic dianhydride compound may be an arbitrary temperature selected from −20 to +150° C., preferably −5 to +100° C. A high molecular-weight polyamic acid can be obtained at a reaction temperature of 5 to 40° C. for a reaction time of 1 to 48 hours. For obtaining a polyamic acid having a low molecular weight and a high storage stability, it is more preferable that the reaction temperature ranges 40 to 80° C. and the reaction time ranges 10 hours or more.

The reaction of the diamine compound and the tetracarboxylic dianhydride compound can be conducted in a solvent. Examples of solvents usable in the reaction include N,N-dimethylformamide, N,N-dimethylacetamide, N-methylpyrrolidone, N-vinylpyrrolidone, N-methylcaprolactam, dimethyl sulfoxide, tetramethylurea, pyridine, dimethyl sulfone, hexamethyl sulfoxide, m-cresol, γ-butyrolactone, ethyl acetate, butyl acetate, ethyl lactate, methyl 3-methoxypropionate, methyl 2-methoxypropionate, ethyl 3-methoxypropionate, ethyl 2-methoxypropionate, ethyl 3-ethoxypropionate, ethyl 2-ethoxypropionate, ethylene glycol dimethyl ether, diethylene glycol dimethyl ether, diethylene glycol diethyl ether, diethylene glycol methylethyl ether, propylene glycol dimethyl ether, dipropylene glycol dimethyl ether, ethylene glycol monomethyl ether, ethylene glycol monoethyl ether, diethylene glycol monomethyl ether, diethylene glycol monoethyl ether, propylene glycol monomethyl ether, propylene glycol monoethyl ether, dipropylene glycol monomethyl ether, dipropylene glycol monoethyl ether, propylene glycol monomethyl ether acetate, Carbitol acetate, ethyl cellosolve acetate, cyclohexanone, methyl ethyl ketone, methyl isobutyl ketone, and 2-heptanone. The solvent may be used alone or in combination. A solvent that does not dissolve the polyamic acid therein may be mixed into the above-mentioned solvent in such an amount that the polyamic acid formed by a polymerization reaction is not deposited.

The thus obtained solution containing the polyamic acid may be used as such in the preparation of the foreign-matter removing coating film forming composition. Alternatively, the polyamic acid may be recovered by precipitation in a poor solvent, such as methanol or ethanol, and isolation, before use.

The polyamic acid contained in the foreign-matter removing coating film forming composition of the present invention, for example, includes polyamic acids of the following formulae (29) to (41) (wherein $p_1$, $p_2$, $p_3$, and $p_4$ represent a ratio of each structure in the polyamic acid). The formulae (29) to (36) are a polyamic acid produced from one tetracarboxylic dianhydride compound and two diamine compounds; the formulae (37) and (38) are a polyamic acid produced from two tetracarboxylic dianhydride compounds and one diamine compound; the formula (39) is a polyamic acid produced from two tetracarboxylic dianhydride compounds and two diamine compounds; and the formulae (40) and (41) are a polyamic acid produced from one tetracarboxylic dianhydride compound and one diamine compound.

[Chemical formula 6]

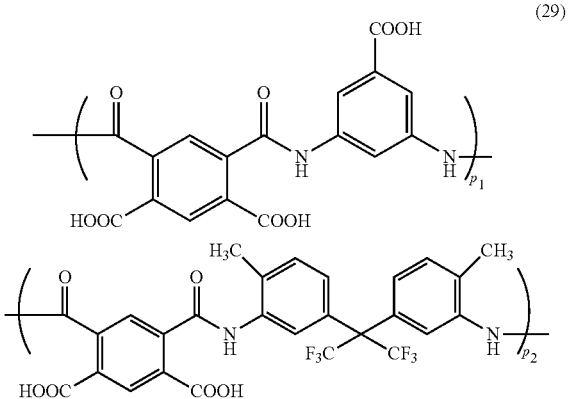

[Chemical formula 7]

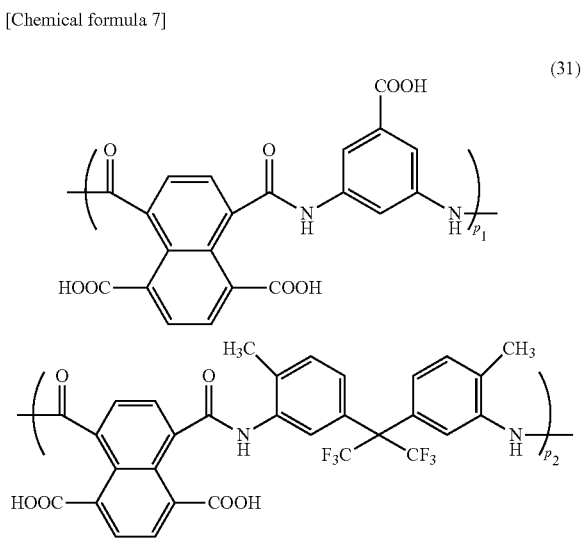

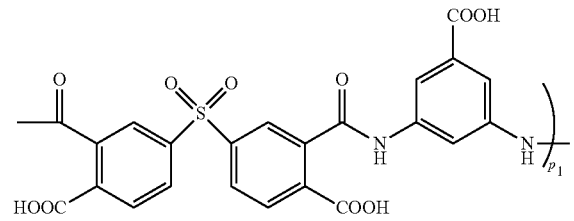

[Chemical formula 8]
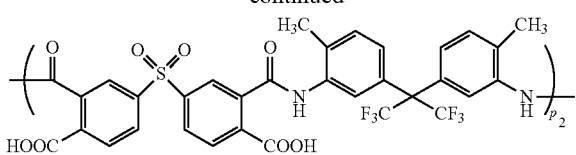
(33)
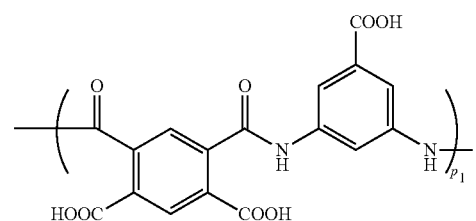
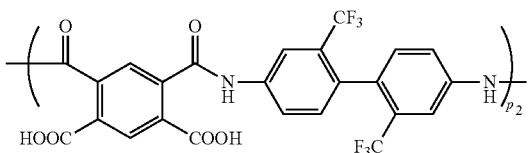
(34)
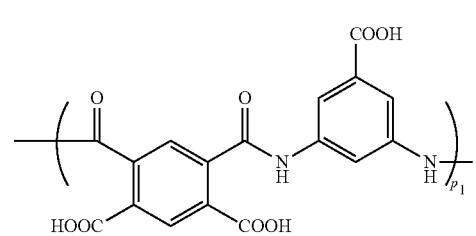
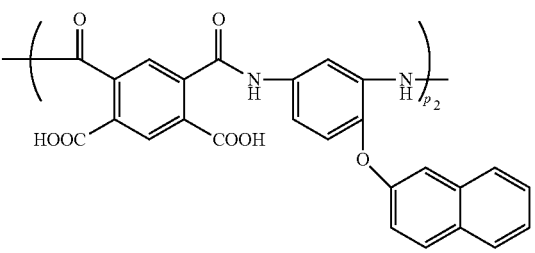
[Chemical formula 9]
(35)
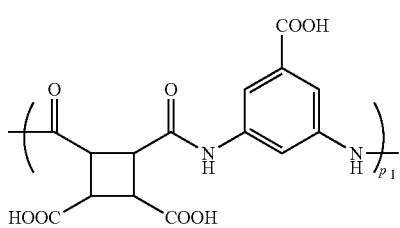
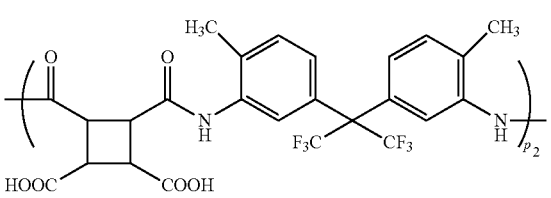
(36)
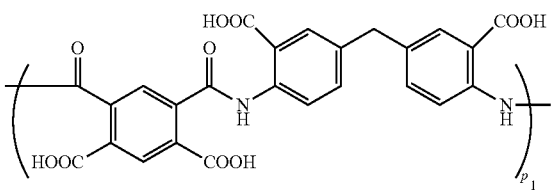
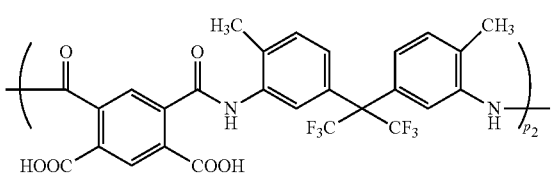
[Chemical formula 10]
(37)
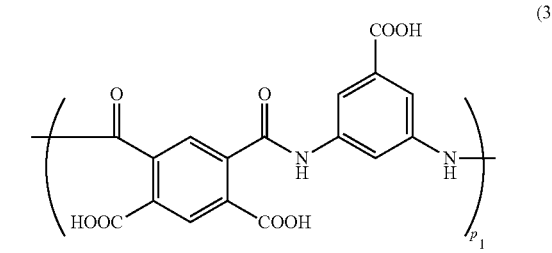
(38)
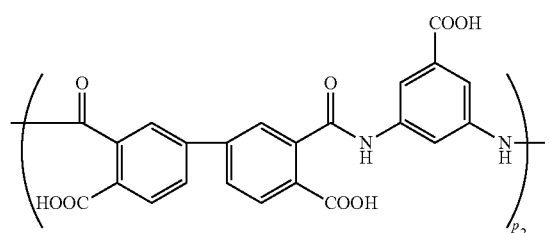
[Chemical formula 11]
(39)
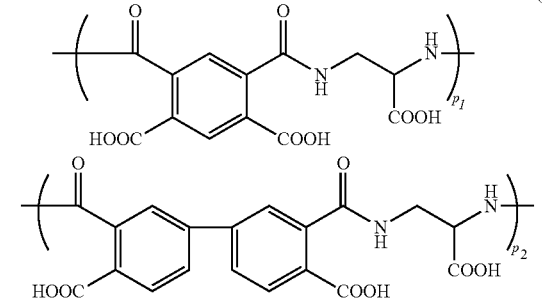
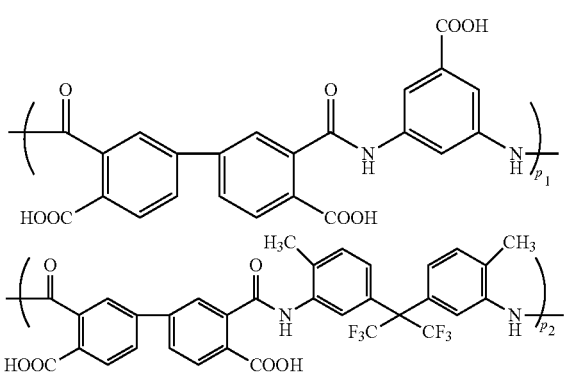

-continued

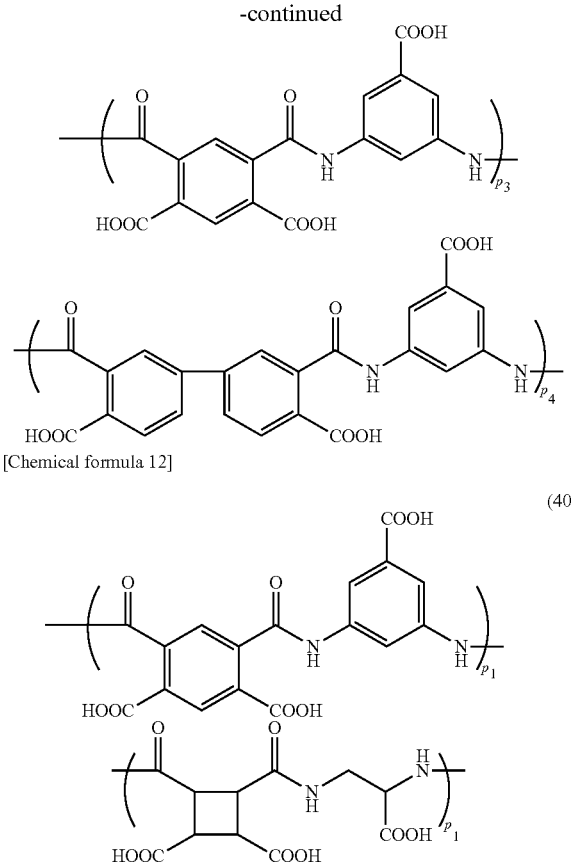

[Chemical formula 12]

<Compound Having at Least Two Epoxy Groups>

The foreign-matter removing coating film forming composition of the present invention may contain a compound having at least two epoxy groups. There is no particular limitation to such a compound as long as it is a compound having epoxy groups. Examples of such compounds includes tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris[p-(2,3-epoxypropoxy)phenyl]propane, diglycidyl 1,2-cyclohexanedicarboxylate, 4,4'-methylenebis(N,N-diglycidylaniline), 3,4-epoxycyclohexylmethyl-3,4-epoxycyclohexanecarboxylate, trimethylolethane triglycidyl ether, bisphenol-A-diglycidyl ether, and pentaerythritol polyglycidyl ether.

As the compound having at least two epoxy groups, a polymer having epoxy groups may be used. There is no particular limitation to the polymer as long as it is a polymer having epoxy groups, and any of such polymers may be used.

The above-mentioned polymer may be produced by addition polymerization using an addition-polymerizable monomer having an epoxy group, or may be produced by a reaction of a polymer compound having a hydroxyl group and a compound having an epoxy group, such as epichlorohydrin or glycidyl tosylate. For example, the polymer includes addition polymerization polymers, such as polyglycidyl acrylate, a copolymer of glycidyl methacrylate and ethyl methacrylate, and a copolymer of glycidyl methacrylate, styrene, and 2-hydroxyethyl methacrylate; and polycondensation polymers, such as epoxy novolak. Such a polymer has a weight average molecular weight of, for example, 300 to 200,000.

Examples of compounds having at least two epoxy groups or epoxy resins having an amino group include YH-434, YH434L (trade name, manufactured by Tohto Kasei Co., Ltd.); examples of epoxy resins having a cyclohexene oxide structure include Epolead GT-401, Epolead GT-403, Epolead GT-301, Epolead GT-302, Celloxide 2021, Celloxide 3000 (trade name, manufactured by Daicel Corporation); examples of bisphenol A epoxy resins include EPIKOTE 1001, EPIKOTE 1002, EPIKOTE 1003, EPIKOTE 1004, EPIKOTE 1007, EPIKOTE 1009, EPIKOTE 1010, EPIKOTE 828 (trade name, each of which is manufactured by Yuka Shell Epoxy Kabushiki Kaisha); examples of bisphenol F epoxy resins include EPIKOTE 807 (trade name, manufactured by Yuka Shell Epoxy Kabushiki Kaisha); examples of phenolic novolak epoxy resins include EPIKOTE 152, EPIKOTE 154 (trade name, each of which is manufactured by Yuka Shell Epoxy Kabushiki Kaisha), EPPN 201, EPPN 202 (trade name, each of which is manufactured by Nippon Kayaku Co., Ltd.); examples of cresol novolak epoxy resins include EOCN-102, EOCN-1035, EOCN-1045, EOCN-1020, EOCN-1025, EOCN-1027 (trade name, each of which is manufactured by Nippon Kayaku Co., Ltd.), and EPIKOTE 180575 (trade name, manufactured by Yuka Shell Epoxy Kabushiki Kaisha); examples of alicyclic epoxy resins include Denacol EX-252 (trade name, manufactured by Nagase Chemtex Corporation), CY175, CY177, CY179 (trade name, each of which is manufactured by CIBA-GEIGY A.G), Araldite CY-182, Araldite CY-192, Araldite CY-184 (trade name, each of which is manufactured by CIBA-GEIGY A.G), EPICLON 200, EPICLON 400 (trade name, each of which is manufactured by DIC Corporation), EPIKOTE 871, EPIKOTE 872 (trade name, each of which is manufactured by Yuka Shell Epoxy Kabushiki Kaisha), and ED-5661, ED-5662 (trade name, each of which is manufactured by Celanese Corporation); and examples of aliphatic polyglycidyl ethers include Denacol EX-611, Denacol EX-612, Denacol EX-614, Denacol EX-622, Denacol EX-411, Denacol EX-512, Denacol EX-522, Denacol EX-421, Denacol EX-313, Denacol EX-314, Denacol EX-321 (trade name, manufactured by Nagase Chemtex Corporation).

The amount of the contained compound having at least two epoxy groups ranges, for example, 5 to 70 parts by mass, or 10 to 60 parts by mass, preferably 15 to 45 parts by mass, relative to 100 parts by mass of the polyamic acid. When the amount of the contained compound having at least two epoxy groups is less than 5 parts by mass, the foreign-matter removing coating film sometimes shows an insufficient degree of cure so that, for example, the coating film would be dissolved in the bonding agent layer to cause intermixing. When the amount of the compound is more than 70 parts by mass, sufficient solubility of the coating film in a developer may not be obtained.

<Solvent>

The foreign-matter removing coating film forming composition of the present invention may be easily prepared by uniformly mixing the above-mentioned components, and it is used in a solution state, in which the components are dissolved in an appropriate solvent. Such a solvent includes, for example, ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, or N-methylpyrrolidone. The solvent may be used alone or in combination. A high boiling-point solvent, such as propylene glycol monobutyl ether or propylene glycol monobutyl ether acetate, may be mixed into the above solvent.

The foreign-matter removing coating film resin composition solution prepared as mentioned above is preferably subjected to filtration using, for example, a filter having a pore diameter of about 0.2 μm, before use. The prepared foreign-matter removing coating film resin composition solution is superior in long-term storage stability at room temperature.

In addition to the above-mentioned polyamic acid, the compound having at least two epoxy groups, and the solvent, the foreign-matter removing coating film forming composition of the present invention may contain a light absorbing compound and a surfactant, for example, as an optional component.

There is no particular limitation to the light absorbing compound as long as it is a compound having absorption at a wavelength of light used in the exposure. A compound having an aromatic ring structure, such as an anthracene ring, a naphthalene ring, a benzene ring, a quinoline ring, or a triazine ring, is preferably used. From the viewpoint of not lowering the solubility of the foreign-matter removing coating film in a developer, a compound having a phenolic hydroxyl group, a carboxyl group, or a sulfonic group, is preferably used.

Examples of light absorbing compounds having an intense absorption to a light having a wavelength of 248 nm include 1-naphthalenecarboxylic acid, 2-naphthalenecarboxylic acid, 1-naphthol, 2-naphthol, 1-aminonaphthalene, 1-hydroxy-2-naphthalenecarboxylic acid, 3-hydroxy-2-naphthalenecarboxylic acid, 3,7-dihydroxy-2-naphthalenecarboxylic acid, 6-bromo-2-hydroxynaphthalene, 1,2-naphthalenedicarboxylic acid, 1,3-naphthalenedicarboxylic acid, 1,4-naphthalenedicarboxylic acid, 1,5-naphthalenedicarboxylic acid, 1,6-naphthalenedicarboxylic acid, 1,7-naphthalenedicarboxylic acid, 1,8-naphthalenedicarboxylic acid, 2,3-naphthalenedicarboxylic acid, 2,6-naphthalenedicarboxylic acid, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, 6-hydroxy-1-naphthalenecarboxylic acid, 1-hydroxy-2-naphthalenecarboxylic acid, 3-hydroxy-2-naphthalenecarboxylic acid, 6-hydroxy-2-naphthalenecarboxylic acid, 1-bromo-2-hydroxy-3-naphthalenecarboxylic acid, 1-bromo-4-hydroxy-3-naphthalenecarboxylic acid, 1,6-dibromo-2-hydroxy-3-naphthalenecarboxylic acid, 3-hydroxy-7-methoxy-2-naphthalenecarboxylic acid, 1-amino-2-naphthol, 1,5-dimercaptonaphthalene, 1,4,5,8-naphthalenetetracarboxylic acid, 3,5-dihydroxy-2-naphthalenecarboxylic acid, 1,4-dihydroxy-2-naphthalenecarboxylic acid, 2-ethoxy-1-naphthalenecarboxylic acid, 2,6-dichloro-1-naphthol, methyl 2-hydroxy-3-naphthalenecarboxylate, methyl 6-hydroxy-2-naphthalenecarboxylate, methyl 3-hydroxy-7-methoxy-2-naphthalenecarboxylate, methyl 3,7-dihydroxy-2-naphthalenecarboxylate, 2,4-dibromo-1-naphthol, 1-bromo-2-naphthol, 2-naphthalenethiol, 4-methoxy-1-naphthol, 6-acetoxy-2-naphthalenecarboxylic acid, 1,6-dibromo-1-naphthol, 2,6-dibromo-1,5-dihydroxynaphthalene, 1-acetyl-2-naphthol, 9-anthracenecarboxylic acid, 1,4,9,10-tetrahydroxyanthracene, and 1,8,9-trihydroxyanthracene.

Examples of light absorbing compounds having an intense absorption to a light having a wavelength of 193 um include benzoic acid, 4-methylbenzoic acid, o-phthalic acid, m-phthalic acid, p-phthalic acid, 2-methoxybenzoic acid, isophthalic acid, terephthalic acid, 2-hydroxybenzoic acid, 3-hydroxybenzoic acid, 4-hydroxybenzoic acid, 2-acetoxybenzoic acid, 2-aminobenzoic acid, 3-aminobenzoic acid, 4-aminobenzoic acid, trimesic acid, 1,4-benzenedicarboxylic acid, 2,3-dimethoxybenzoic acid, 2,4-dimethoxybenzoic acid, 2,5-dimethoxybenzoic acid, 2,4-dihydroxybenzoic acid, 2,6-dihydroxybenzoic acid, 3,4-dihydroxybenzoic acid, 3,5-dihydroxybenzoic acid, 4-acetylbenzoic acid, pyromellitic acid, trimesic anhydride, 2-[bis-(4-hydroxyphenyl)-methyl]benzoic acid, 3,4,5-trihydroxybenzoic acid, 2-benzophenonecarboxylic acid, m-phenylbenzoic acid, 3-(4'-hydroxyphenoxy)benzoic acid, 3-phenoxybenzoic acid, phenol, 1,4-dihydroxybenzene, 1,3-dihydroxybenzene, 1,2-dihydroxybenzene, 2-methylphenol, 3-methylphenol, 4-methylphenol, 1,3,5-trihydroxybenzene, 2,2-bis-4-hydroxyphenylpropane, 2-hydroxybiphenyl, 2-aminophenol, 3-aminophenol, 4-aminophenol, and 4-benzyloxyphenol.

For suppressing sublimation of the above light absorbing compound during the baking for forming the foreign-matter removing coating film, the light absorbing compound may be reacted with a polymer or a compound having one or more reactive groups before use.

For example, in the case of a light absorbing compound having a carboxyl group or a phenolic hydroxyl group, there may be used a compound obtained by reacting the light absorbing compound with a polyfunctional epoxy compound, such as tris(2,3-epoxypropyl) isocyanurate, 1,4-butanediol diglycidyl ether, 1,2-epoxy-4-(epoxyethyl)cyclohexane, glycerol triglycidyl ether, diethylene glycol diglycidyl ether, 2,6-diglycidylphenyl glycidyl ether, 1,1,3-tris(p-(2,3-epoxypropoxy)phenyl)propane, diglycidyl 1,2-cyclohexanedicarboxylate, 4,4'-methylenebis(N,N-diglycidylaniline), 3,4-epoxycyclohexylmethyl-3,4-epoxycyclohexanecarboxylate, trimethylolethane triglycidyl ether, bisphenol-A-diglycidyl ether, or pentaerythritol polyglycidyl ether, or a polymer containing a structure having an epoxy group, such as glycidyl methacrylate. For example, polymers having a unit structure represented by the formula (42), (43), or (44) below, and a compound represented by the formula (45) below may be given. In the formula (45), Ar represents a benzene ring, a naphthalene ring, or an anthracene ring, which is optionally substituted with an alkyl group having 1 to 5 carbon atoms, an alkoxy group having 1 to 5 carbon atoms, a fluorine atom, a chlorine atom, a bromine atom, an iodine atom, a nitro group, a cyano group, a hydroxyl group, a thiol group, a thioalkyl group having 1 to 5 carbon atoms, a carboxyl group, a phenoxy group, an acetyl group, an alkoxycarbonyl group having 1 to 5 carbon atoms, or a vinyl group.

[Chemical formula 13]

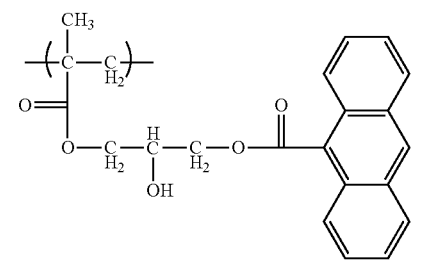
(42)

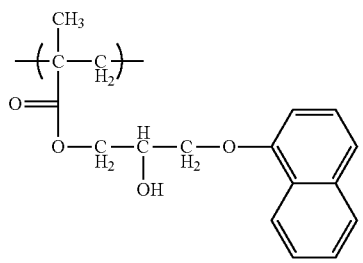
(43)

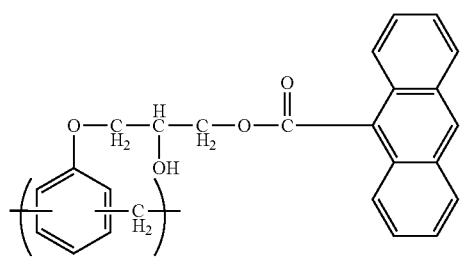
(44)

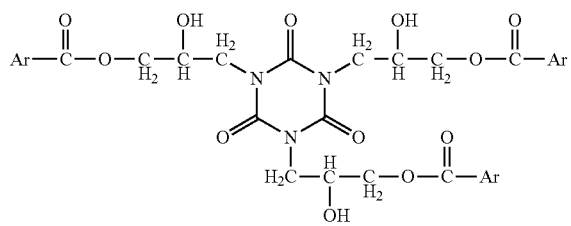
(45)

The above-mentioned light absorbing compound may be used alone or in combination. When a light absorbing compound is used, the amount of the light absorbing compound contained ranges, for example, 1 to 300 parts by mass, or 1 to 200 parts by mass, or, for example, 1 to 100 parts by mass, or 5 to 100 parts by mass, relative to 100 parts by mass of the polyamic acid. When the amount of the light absorbing compound is more than 300 parts by mass, the solubility of the foreign-matter removing coating film in a developer is sometimes lowered, or intermixing of the foreign-matter removing coating film with the bonding agent layer is sometimes caused.

The foreign-matter removing coating film forming composition of the present invention may contain an acid generator. Examples of acid generators include thermal acid generators, such as 2,4,4,6-tetrabromocyclohexadienone, benzoin tosylate, 2-nitrobenzyl tosylate, and other organic sulfonic acid alkyl esters; and photo-acid generators, such as bis(4-tert-butylphenyl)iodonium trifluoromethanesulfonate, triphenylsulfonium trifluoromethanesulfonate, phenyl-bis(trichloromethyl)-s-triazine, benzoin tosylate, and N-hydroxysuccinimide trifluoromethanesulfonate. The amount of the acid generator added is, if necessary, 10% by mass or less, preferably 3% by mass or less, based on the mass of the solid content of the foreign-matter removing coating film forming composition.

In the foreign-matter removing coating film forming composition of the present invention, for the purpose of increasing the dissolution rate (solubility) in a developer, a polyhydric phenol compound or a carboxyl group-containing compound may be added. There is no particular limitation to the compound, and the compound includes, for example, polyhydric phenols, such as tris-hydroxyphenylethane, bisphenol-A, bisphenol-S, 4,4'-isopropylidene-di-o-cresol, 5-tert-butylpyrogallol, hexafluorobisphenol-A, 3,3,3',3'-tetramethyl-1,1'-spirobisindan-5,5',6,6'-tetrol, 4,4'-(9-fluorenylidene)diphenol, bisphenol-AP, bisphenol-P, 5-α,α-dimethyl-4-hydroxybenzylsalicylic acid, α,α,α'-tris(4-hydroxyphenyl)-1-ethyl-4-isopropylbenzene, and 5,5'-di-tert-butyl-2,2',4,4'-tetrahydroxybenzophenone; polycarboxylic acids, such as pyromellitic acid, phthalic acid, trimellitic acid, 4-sulfophthalic acid, benzenehexacarboxylic acid, 2,3-naphthalenedicarboxylic acid, 4-hydroxyphthalic acid, 3,4-dihydroxyphthalic acid, 4,5-dihydroxyphthalic acid, 3,3'-,4,4'-biphenyltetracarboxylic acid, 3,3'-,4,4'-benzophenonetetracarboxylic acid, 3,3'-,4,4'-diphenyl ether tetracarboxylic acid, 3,3'-,4,4'-diphenyl sulfone tetracarboxylic acid, 1,2,3,4-cyclobutanetetracarboxylic acid, 1,2-dimethyl-1,2,3,4-cyclobutanetetracarboxylic acid, 1,2,3,4-tetramethyl-1,2,3,4-cyclobutanetetracarboxylic acid, 1,2,3,4-cyclopentanetetracarboxylic acid, 1,2,3,4-cyclohexanetetracarboxylic acid, and 3,4-dicarboxy-1,2,3,4-tetrahydro-1-naphthalenesuccinic acid; carboxylic acid- or carboxylic anhydride-containing polymers, such as polyacrylic acid, polymethacrylic acid, polyamic acid, and polymaleic anhydride; and phenolic hydroxyl group-containing polymers, such as phenolic novolak, polyhydroxystyrene, and naphthol novolak. The amount of the above-mentioned compound added is, if necessary, 20% by mass or less, preferably 10% by mass or less, based on the mass of the solid content of the foreign-matter removing coating film forming composition.

For the purpose of controlling the dissolution rate (solubility) in a developer, a compound having a carboxyl group or phenolic hydroxyl group protected by such a group that is readily decomposed in the presence of an acid, e.g., a tert-butyl group, a tetrahydropyranyl group, a 1-ethoxyethyl group, or a trimethylsilyl group, may be added to the foreign-matter removing coating film forming composition of the present invention.

Such compounds include, for example, di-tert-butyl malonate, tert-butyl acetate, tert-butyl propionate, tert-butyl acetoacetate, tert-amyl acetate, tert-butyl benzoate, and tert-butyl pivalate. They also include the compounds of the following formulae (46) to (54).

[Chemical formula 14]

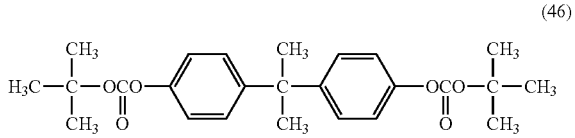
(46)

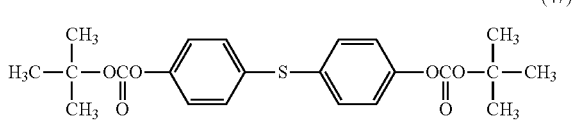
(47)

-continued

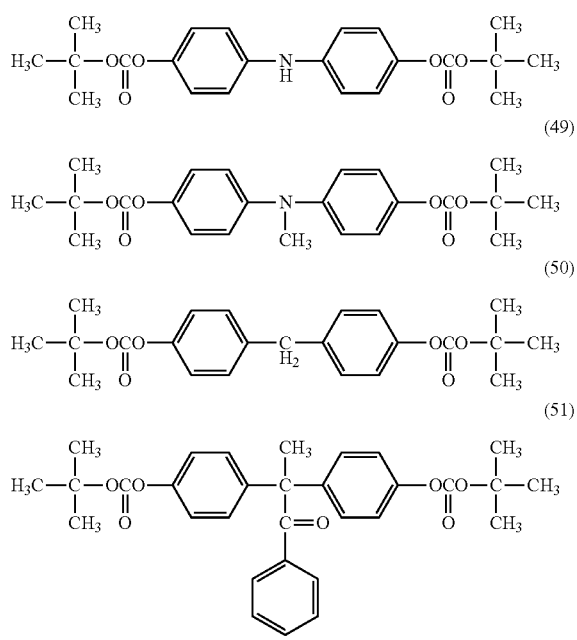

(48)
(49)
(50)
(51)

[Chemical formula 15]

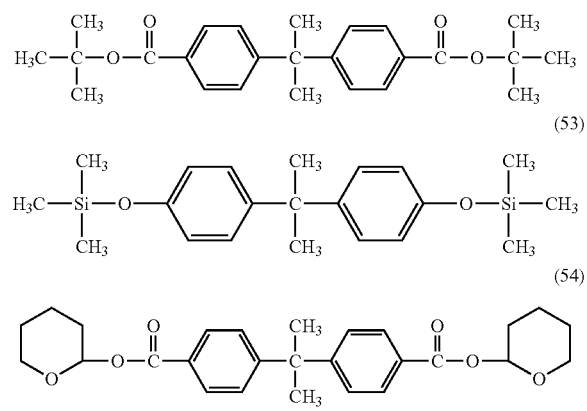

(52)
(53)
(54)

The above-mentioned compounds can easily form a carboxyl group or a phenolic hydroxyl group in the presence of an acid, providing a compound having an increased solubility in an alkaline developer.

Therefore, it is preferred that the above-mentioned compound is added, together with a photo-acid generator, to the foreign-matter removing coating film forming composition. That is, the carboxyl group or phenolic hydroxyl group of the compound having a carboxyl group or phenolic hydroxyl group protected by a group that is easily decomposed in the presence of an acid is regenerated by an acid generated from the photo-acid generator due to the exposure in the exposed region of the foreign-matter removing coating film formed from the foreign-matter removing coating film forming composition containing the above-mentioned compound having a carboxyl group or phenolic hydroxyl group protected by a group that is easily decomposed in the presence of an acid and a photo-acid generator. As the result, the solubility of the exposed region of the foreign-matter removing coating film in an alkaline solution is increased. In contrast, in the unexposed region, there is no change in the compound having a carboxyl group or phenolic hydroxyl group protected by a group that is easily decomposed in the presence of an acid. Hence the solubility of the unexposed region of the foreign-matter removing coating film in an alkaline solution is not increased. As such, use of the compound having a carboxyl group or phenolic hydroxyl group protected by a group that is easily decomposed in the presence of an acid and the photo-acid generator in combination can cause a difference in the solubility in an alkaline developer between the exposed region and the unexposed region of the foreign-matter removing coating film after the exposure, which facilitates the pattern formation by development.

When the above-mentioned compound having a carboxyl group or phenolic hydroxyl group protected by a group that is easily decomposed in the presence of an acid is used, the amount of the compound contained ranges, for example, 50 to 1 part by mass, or 30 to 5 parts by mass, or, for example, 20 to 10 parts by mass, relative to 100 parts by mass of the polyamic acid. When a photo-acid generator is used together with the compound having a carboxyl group or phenolic hydroxyl group protected by a group that is easily decomposed in the presence of an acid, the amount of the photo-acid generator contained ranges, for example, 0.1 to 30 parts by mass, or 0.5 to 20 parts by mass, or, for example, 1 to 10 parts by mass, relative to 100 parts by mass of the compound having a carboxyl group or phenolic hydroxyl group protected by a group that is easily decomposed in the presence of an acid.

The foreign-matter removing coating film forming composition of the present invention may contain a surfactant. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, fluorine surfactants, such as EFTOP EF301, EF303, EF352 (trade name, manufactured by Tohchem Products Co., Ltd.), MEGAFACE F171, F173 (trade name, manufactured by DIC Corporation), Fluorad FC430, FC431 (trade name, manufactured by Sumitomo 3M), and AsahiGuard AG710, Surflon S-382, SC101, SC102, SC103, SC104, SC105, SC106 (trade name, manufactured by Asahi Glass Co., Ltd.), and organosiloxane polymer KP341 (trade name, manufactured by Shin-Etsu Chemical Co., Ltd.). The amount of the surfactant incorporated ranges generally 0.2% by mass or less, preferably 0.1% by mass or less, based on the total mass of the all components of the foreign-matter removing coating film forming composition of the present invention. The surfactant may be added alone or in combination.

The foreign-matter removing coating film forming composition of the present invention may, if necessary, further contain, for example, a rheology modifier or a bonding auxiliary.

The use of the foreign-matter removing coating film forming composition of the present invention is described below.

The foreign-matter removing coating film forming composition of the present invention is applied onto a semiconductor substrate (for example, a silicon/silicon dioxide coated substrate, a silicon nitride substrate, a glass substrate, or an ITO substrate) by an appropriate application method, such as a spinner, a coater, or immersion, and then baked to form foreign matter removing coating film. Conditions for baking are appropriately selected from those at a baking temperature of 80 to 300° C. for a baking time of 0.3 to 60 minutes.

The foreign-matter removing coating film of the present invention generally has a thickness of 1 μm to 5 nm, preferably 500 to 10 nm, most preferably 300 to 15 nm.

The dissolution rate (solubility) of the formed foreign-matter removing coating film in a developer for photoresist ranges 0.1 to 50 nm per second, preferably 0.2 to 40 nm per second, more preferably 0.3 to 20 nm per second. A dissolution rate smaller than the above value would require a prolonged period of time for removing the foreign-matter removing coating film, and lower the productivity.

The foreign-matter removing coating film formed from the foreign-matter removing coating film forming composition of the present invention permits controlling the dissolution rate thereof in a developer by changing the baking conditions for the formation of the film. At a constant baking time, formation of a foreign matter removing coating film having a smaller dissolution rate in a developer is possible as the baking temperature is made higher.

The foreign-matter removing coating film of the present invention, after being formed, may be subjected to exposure. The exposure may be made over the entire surface of a wafer, or may be made through a mask having a predetermined pattern. In the exposure, for example, a KrF excimer laser (wavelength: 248 nm), an ArF excimer laser (wavelength: 193 nm), or an F2 excimer laser (wavelength: 157 nm) may be used. After the exposure, if necessary, post exposure baking (PEB) may be performed.

Then, the foreign-matter removing coating film is removed using a developer. Examples of developers include alkaline aqueous solutions, e.g., aqueous solutions of an alkali metal hydroxide, such as potassium hydroxide or sodium hydroxide, aqueous solutions of a quaternary ammonium hydroxide, such as tetramethylammonium hydroxide, tetraethylammonium hydroxide, or choline, and aqueous solutions of an amine, such as ethanolamine, propylamine, or ethylenediamine. For example, a surfactant may be added to the above developer. Conditions for removing the foreign-matter removing coating film are appropriately selected from those at a temperature of 5 to 50° C. for a time of 2 to 500 seconds, or 3 to 400 seconds.

The foreign-matter removing coating film formed from the foreign-matter removing coating film forming composition of the present invention can be easily peeled off at room temperature (for example, at 25° C.) using a 2.38% by mass aqueous solution of tetramethylammonium hydroxide generally used.

The dissolution rate (solubility) in a developer of the foreign-matter removing coating film of the present invention can vary depending on the baking temperature for the film. Therefore, it is possible to optimize the conditions for removing the film. For example, in the case of using a substrate having an unsatisfactory resistance to a developer, baking the film at a lowered temperature enables removal of the film in a shorter time, which would permit minimizing damage to the substrate. For example, when the baking is conducted at 190° C. as described in Examples 1 to 4, the film can be removed within 5 seconds.

<Method for Removing Foreign Matters>

The method for removing foreign matters of the present invention is a method for removing foreign matters, which comprises the steps of: applying the above-described composition onto a substrate and baking the applied composition to form a coating film; allowing foreign matters to form on the film; and letting a developer act on the film to remove the film.

After the step of forming the coating film, the method may further comprise the step of forming a bonding layer and then peeling the bonding layer off. The foreign matters may be a peeling residue after forming the bonding layer.

Examples of the substrates include glass and metal-containing compounds or semi-metal-containing compounds. Examples of metal-containing compounds or semi-metal-containing compounds include ceramics which are sintered products having a metal oxide as a basic component and being obtained by sintering by heat treatment at high temperatures; semiconductors, such as silicon, inorganic solid materials, such as shaped articles of an inorganic compound, e.g., a metal oxide or a semi-metal oxide (such as a silicon oxide or alumina); a metal carbide or a semi-metal carbide; a metal nitride or a semi-metal nitride (such as a silicon nitride); or a metal boride or a semi-metal boride; aluminum; nickel titanium; and stainless steel (such as SUS304, SUS316, and SUS316L); but preferred is a silicon substrate (for example, a silicon wafer for semiconductor for use in the production of a semiconductor device).

<Method for Treating a Substrate>

The method for treating a substrate comprises the steps of: applying the above-described composition onto a substrate and baking the applied composition to form a coating film; forming a bonding layer on the film; temporarily bonding another substrate to the substrate; peeling the another substrate off; and peeling the film off using a developer.

The method for treating a substrate of the present invention is applied to, for example, a so-called wafer temporarily bonding step.

<Bonding Agent Layer>

The bonding agent layer is formed using a known bonding agent and method. As a bonding agent, a wafer temporarily bonding agent of an application type described in, for example, WO 2015/190438 A1, a temporarily bonding material of Thin Materials AG (Nissan Chemical Industries, Ltd.), a semiconductor wafer temporarily bonding material manufactured by Toray Industries Inc., or WaferBOND (registered trademark) CR-200, HT-10.10 (manufactured by Brewer Science, Inc.) may be used, or a tape-form bonding agent (for example, a back-grinding tape (e.g., 3M™ temporarily fixing adhesive tape ATT-4025 (3M Japan Limited), E Series, P Series, S Series (trade name, manufactured by Lintec Corporation), or ICROS Tape (registered trademark) (manufactured by Mitsui Chemicals Tohcello, Inc.)), or a dicing tape (for example, Solvent-resistant Dicing Tape (trade name, manufactured by Nitto Denko Corporation), heat-sensitive adhesive sheet Intelimer (registered trademark) tape (manufactured by Nitta Corporation), or Intelimer (registered trademark) tape (manufactured by Anchor Techno, Ltd.)) may be used.

A bonding agent for wafer applied to a specific wafer handling system (for example, Zero Newton (registered trademark), Tokyo Ohka Kogyo Co., Ltd.) may be used.

For example, the back-grinding tape is comprised of a substrate film, an adhesive layer, and a release film. In the substrate film, a soft thermoplastic film, such as an ethylene-vinyl acetate copolymer (EVA), has been used, but, for the purpose of improving the supporting properties for a wafer, the use of a rigid stretched film, such as polyethylene terephthalate (PET), is being attempted. Thereafter, further improvements have been made, and a design of lamination of two types of films having different moduli, for example, a design of lamination of PET and an ethylene copolymer and a design of lamination of polypropylene (PP) and an ethylene copolymer have been reported.

The adhesive is generally of an acrylic type. With respect to acrylic adhesives, a design has been known such that crosslinking is caused by reacting a curing agent with an acrylic copolymer from a monomer having a low glass transition temperature, such as butyl acrylate, as the major raw material. The back-grinding tape is bonded to the wafer circuit surface, and therefore, there is a concern about contamination derived from the adhesive after peeling the tape. For this reason, there is a report of a design using an emulsion type adhesive with the expectation of removal of potentially remaining adhesive by rinsing it with water, but it is difficult to completely remove the remaining adhesive. By forming the foreign-matter removing coating film of the present invention on the circuit surface and then forming a bonding layer, foreign matters (bonding agent residue) caused in the subsequent peeling step can be completely removed by cleansing using a developer, and the wiring portions including circuits suffer no damage.

<Method for Producing a Laminated Substrate>

A laminated substrate having a substrate—the film-bonding layer-substrate construction may be produced through a process comprising the steps of: applying the above-described composition onto a substrate and baking the applied composition to form a coating film; forming a bonding layer on the film; and bonding another substrate to the substrate. It is preferred that one substrate is a semiconductor substrate and another one is a supporting substrate for maintaining the shape of the semiconductor substrate. It is also preferred that the bonding layer enables, for example, the semiconductor substrate and the supporting substrate to be peeled off from each other. The bonding layer is as described above.

Hereinbelow, the present invention will be described in more detail with reference to the following Examples, which should not be construed as limiting the scope of the present invention.

EXAMPLES

Example 1

(Synthesis of a Polyamic Acid)

4.36 g of pyromellitic dianhydride, 1.19 g of diaminobenzoic acid, and 4.26 g of 2,2-bis(3-amino-4-tolyl) hexafluoropropane were reacted in 55.6 g of propylene glycol monomethyl ether at 60° C. for 25 hours to obtain a solution [A] containing a polyamic acid.

(Synthesis of a Light Absorbing Compound)

19.0 g of 3,7-dihydroxy-2-naphthoic acid, 10 g of tris(2,3-epoxypropyl) isocyanurate, and 0.552 g of benzyltriethylammonium chloride were reacted in 118 g of cyclohexanone at 130° C. for 24 hours to obtain a solution [a] containing a light absorbing compound.

(Preparation of Foreign Matter Removing Coating Film Forming Composition)

To 14.0 g of the solution [A] containing a polyamic acid were added 4.38 g of the solution [a] containing a light absorbing compound, 0.630 g of tris(2,3-epoxypropyl) isocyanurate, 52.3 g of propylene glycol monomethyl ether, and 67.5 g of propylene glycol monomethyl ether acetate. The resultant mixture was stirred at room temperature for 30 minutes to prepare a solution [1] of foreign-matter removing coating film forming composition.

(Evaluation of the Foreign-Matter Removing Coating Film Forming Composition)

The solution [1] of foreign-matter removing coating film forming composition was applied onto a silicon wafer substrate using a spinner, and then baked on a hotplate at 200° C. for 60 seconds to form a foreign matter removing coating film having a thickness of 40 nm. The obtained foreign-matter removing coating film was insoluble in ethyl lactate and propylene glycol monomethyl ether acetate. Measurement of the foreign-matter removing coating film using an ellipsometer showed that the film had a refractive index (n value) of 1.67 and an attenuation coefficient (k value) of 0.39 at a wavelength of 248 nm, and had a refractive index (n value) of 1.53 and an attenuation coefficient (k value) of 0.42 at a wavelength of 193 nm.

Also, foreign-matter removing coating films were formed in substantially the same manner as described above except that the baking temperature was changed to 190° C., 210° C., or 220° C. It was found that these foreign-matter removing coating films were insoluble in ethyl lactate and propylene glycol monomethyl ether acetate.

Then, a dissolution rate (solubility) of the foreign-matter removing coating film in a developer (trade name NMD-3, manufactured by Tokyo Ohka Kogyo Co., Ltd.) was determined using a resist development analyzer (manufactured by Litho Tech Japan Co., Ltd.). The temperature of the atmosphere surrounding the analyzer was 25° C. The foreign-matter removing coating film formed at a baking temperature of 190° C. for a baking time of 60 seconds had a dissolution rate of 10.7 nm per second. The foreign-matter removing coating film formed at a baking temperature of 200° C. for a baking time of 60 seconds had a dissolution rate of 2.0 nm per second, the foreign-matter removing coating film formed at a baking temperature of 210° C. for a baking time of 60 seconds had a dissolution rate of 0.9 nm per second, and the foreign-matter removing coating film formed at a baking temperature of 220° C. for a baking time of 60 seconds had a dissolution rate of 0.61 nm per second. In other words, the foreign-matter removing coating film formed at a baking temperature of 190° C. for a baking time of 60 seconds can be completely removed in 3.7 seconds, the foreign-matter removing coating film formed at a baking temperature of 200° C. for a baking time of 60 seconds can be completely removed in 20 seconds, the foreign-matter removing coating film formed at a baking temperature of 210° C. for a baking time of 60 seconds can be completely removed in about 44.4 seconds, and the foreign-matter removing coating film formed at a baking temperature of 220° C. for a baking time of 60 seconds can be completely removed in about 65.6 seconds. Therefore, the foreign matters present on the above foreign-matter removing coating film can also be removed.

The solution [1] of foreign-matter removing coating film forming composition was applied onto a silicon wafer substrate using a spinner, and then baked on a hotplate at 220° C. for 60 seconds to form a foreign matter removing coating film having a thickness of 40 nm. A positive photoresist film for KrF was formed on the obtained foreign-matter removing coating film, and subjected to exposure using a KrF excimer laser (wavelength: 248 nm) through a mask, which was set so as to form a 200 nm line and space (L/S) pattern.

The resultant film was subjected to post exposure baking at 110° C. for 90 seconds, and then subjected to puddle development using a 2.38% aqueous solution of tetramethylammonium hydroxide (trade name NMD-3, manufactured by Tokyo Ohka Kogyo Co., Ltd.) as a developer for photoresist for 60 seconds. The exposed region of both the photoresist and the foreign-matter removing coating film was dissolved, and no residual film was seen even at the 200 nm line and space (L/S).

Example 2

(Preparation of Foreign Matter Removing Coating Film Forming Composition)

To 14.0 g of the polyamic acid solution [A] used in Example 1 were added 4.38 g of the solution [a] containing a light absorbing compound used in Example 1, 0.630 g of tris(2,3-epoxypropyl) isocyanurate, 0.0450 g of 2,4,6-tris(4-hydroxyphenylmethyl)-1,3-benzenediol, 52.8 g of propylene glycol monomethyl ether, and 67.5 g of propylene glycol monomethyl ether acetate. The resultant mixture was stirred at room temperature for 30 minutes to prepare a solution [2] of foreign-matter removing coating film forming composition.

(Evaluation of the Foreign-Matter Removing Coating Film Forming Composition)

The solution [2] of foreign-matter removing coating film forming composition was applied onto a silicon wafer substrate using a spinner, and then baked on a hotplate at 200° C. for 60 seconds to form a foreign matter removing coating film having a thickness of 40 nm. The obtained foreign-matter removing coating film was insoluble in ethyl lactate and propylene glycol monomethyl ether acetate. Measurement of the foreign-matter removing coating film using an ellipsometer showed that the film had a refractive index (n value) of 1.67 and an attenuation coefficient (k value) of 0.39 at a wavelength of 248 nm, and had a refractive index (n value) of 1.53 and an attenuation coefficient (k value) of 0.42 at a wavelength of 193 nm.

Also, foreign-matter removing coating films were formed in substantially the same manner as described above except that the baking temperature was changed to 190° C., 210° C., or 220° C. It was found that these foreign-matter removing coating films were insoluble in ethyl lactate and propylene glycol monomethyl ether acetate.

Then, a dissolution rate of the foreign-matter removing coating film in a developer (trade name NMD-3, manufactured by Tokyo Ohka Kogyo Co., Ltd.) was determined using a resist development analyzer (manufactured by Litho Tech Japan Co., Ltd.). The temperature of the atmosphere surrounding the analyzer was 25° C. The foreign-matter removing coating film formed at a baking temperature of 190° C. for a baking time of 60 seconds had a dissolution rate of 11.7 nm per second. The foreign-matter removing coating film formed at a baking temperature of 200° C. for a baking time of 60 seconds had a dissolution rate of 2.3 nm per second, the foreign-matter removing coating film formed at a baking temperature of 210° C. for a baking time of 60 seconds had a dissolution rate of 1.1 nm per second, and the foreign-matter removing coating film formed at a baking temperature of 220° C. for a baking time of 60 seconds had a dissolution rate of 0.83 nm per second.

In other words, the foreign-matter removing coating film formed at a baking temperature of 190° C. for a baking time of 60 seconds can be completely removed in about 3.4 seconds, the foreign-matter removing coating film formed at a baking temperature of 200° C. for a baking time of 60 seconds can be completely removed in about 17.4 seconds, the foreign-matter removing coating film formed at a baking temperature of 210° C. for a baking time of 60 seconds can be completely removed in about 36.4 seconds, and the foreign-matter removing coating film formed at a baking temperature of 220° C. for a baking time of 60 seconds can be completely removed in about 48.2 seconds. Therefore, the foreign matter present on the above foreign-matter removing coating film can also be removed.

The solution [2] of foreign-matter removing coating film forming composition was applied onto a silicon wafer substrate using a spinner, and then baked on a hotplate at 220° C. for 60 seconds to form a foreign matter removing coating film having a thickness of 40 nm. A positive photoresist film for KrF was formed on the obtained foreign-matter removing coating film, and subjected to exposure using a KrF excimer laser (wavelength: 248 nm) through a mask, which was set so as to form a 200 nm line and space (L/S) pattern. The resultant film was subjected to post exposure baking at 110° C. for 90 seconds, and then subjected to puddle development using a 2.38% aqueous solution of tetramethylammonium hydroxide (trade name NMD-3, manufactured by Tokyo Ohka Kogyo Co., Ltd.) as a developer for photoresist for 60 seconds. The exposed region of both the photoresist and the foreign-matter removing coating film was dissolved, and no residual film was seen even at the 200 nm line and space (L/S).

Example 3

(Synthesis of a Polyamic Acid)

4.36 g of pyromellitic dianhydride, 0.89 g of diaminobenzoic acid, and 4.97 g of 2,2-bis(3-amino-4-tolyl) hexafluoropropane were reacted in 55.6 g of propylene glycol monomethyl ether at 60° C. for 25 hours to obtain a solution [B] containing a polyamic acid.

(Preparation of Foreign Matter Removing Coating Film Forming Composition)

To 14.0 g of the solution [B] containing a polyamic acid were added 4.38 g of the solution [a] containing a light absorbing compound used in Example 1, 0.630 g of tris(2, 3-epoxypropyl) isocyanurate, 52.4 g of propylene glycol monomethyl ether, and 67.5 g of propylene glycol monomethyl ether acetate, and the resultant mixture was stirred at room temperature for 30 minutes to prepare a solution [3] of foreign-matter removing coating film forming composition.

(Evaluation of the Foreign-Matter Removing Coating Film Forming Composition)

The solution [3] of foreign-matter removing coating film forming composition was applied onto a silicon wafer substrate using a spinner, and then baked on a hotplate at 200° C. for 60 seconds to form a foreign matter removing coating film having a thickness of 40 nm. The obtained foreign-matter removing coating film was insoluble in ethyl lactate and propylene glycol monomethyl ether acetate. Measurement of the foreign-matter removing coating film using an ellipsometer showed that the film had a refractive index (n value) of 1.67 and an attenuation coefficient (k value) of 0.39 at a wavelength of 248 nm, and had a refractive index (n value) of 1.53 and an attenuation coefficient (k value) of 0.42 at a wavelength of 193 nm.

Also, foreign-matter removing coating films were formed in substantially the same manner as described above except that the baking temperature was changed to 190° C., 210° C., or 220° C. It was found that these foreign-matter removing coating films were insoluble in ethyl lactate and propylene glycol monomethyl ether acetate.

Then, a dissolution rate of the foreign-matter removing coating film in a developer (trade name NMD-3, manufactured by Tokyo Ohka Kogyo Co., Ltd.) was determined using a resist development analyzer (manufactured by Litho Tech Japan Co., Ltd.). The temperature of the atmosphere surrounding the analyzer was 25° C. The foreign-matter removing coating film formed at a baking temperature of 190° C. for a baking time of 60 seconds had a dissolution rate of 9.7 nm per second. The foreign-matter removing coating film formed at a baking temperature of 200° C. for a baking time of 60 seconds had a dissolution rate of 1.7 nm per second, the foreign-matter removing coating film formed at a baking temperature of 210° C. for a baking time of 60 seconds had a dissolution rate of 0.7 nm per second, and the foreign-matter removing coating film formed at a baking temperature of 220° C. for a baking time of 60 seconds had a dissolution rate of 0.53 nm per second.

In other words, the foreign-matter removing coating film formed at a baking temperature of 190° C. for a baking time of 60 seconds can be completely removed in about 4.1 seconds, the foreign-matter removing coating film formed at a baking temperature of 200° C. for a baking time of 60 seconds can be completely removed in about 23.5 seconds, the foreign-matter removing coating film formed at a baking temperature of 210° C. for a baking time of 60 seconds can be completely removed in about 57.1 seconds, and the foreign-matter removing coating film formed at a baking temperature of 220° C. for a baking time of 60 seconds can be completely removed in about 75.5 seconds. Therefore, the foreign matter present on the above foreign-matter removing coating film can also be removed.

The solution [3] of foreign-matter removing coating film forming composition was applied onto a silicon wafer substrate using a spinner, and then baked on a hotplate at 210° C. for 60 seconds to form a foreign matter removing coating film having a thickness of 40 nm. A positive photoresist film for KrF was formed on the obtained foreign-matter removing coating film, and subjected to exposure using a KrF excimer laser (wavelength: 248 nm) through a mask, which was set so as to form a 200 nm line and space (L/S) pattern.

The resultant film was subjected to post exposure baking at 110° C. for 90 seconds, and then subjected to puddle development using a 2.38% aqueous solution of tetramethylammonium hydroxide (trade name NMD-3, manufactured by Tokyo Ohka Kogyo Co., Ltd.) as a developer for photoresist for 60 seconds. The exposed region of both the photoresist and the foreign-matter removing coating film was dissolved, and no residual film was seen even at the 200 nm line and space (L/S).

Example 4

(Preparation of Foreign Matter Removing Coating Film Forming Composition)

To 14.0 g of the polyamic acid solution [A] used in Example 1 were added 4.38 g of the solution [a] containing a light absorbing compound used in Example 1, 0.630 g of 4,4'-methylenebis(diglycidylaniline) (manufactured by Tohto Kasei Co., Ltd.), 52.8 g of propylene glycol monomethyl ether, and 67.5 g of propylene glycol monomethyl ether acetate, and the resultant mixture was stirred at room temperature for 30 minutes to prepare a solution [4] of foreign-matter removing coating film forming composition.

(Evaluation of the Foreign-Matter Removing Coating Film Forming Composition)

The solution [4] of foreign-matter removing coating film forming composition was applied onto a silicon wafer substrate using a spinner, and then baked on a hotplate at 200° C. for 60 seconds to form a foreign matter removing coating film having a thickness of 40 nm. The obtained foreign-matter removing coating film was insoluble in ethyl lactate and propylene glycol monomethyl ether acetate. Measurement of the foreign-matter removing coating film using an ellipsometer showed that the film had a refractive index (n value) of 1.67 and an attenuation coefficient (k value) of 0.39 at a wavelength of 248 nm, and had a refractive index (n value) of 1.53 and an attenuation coefficient (k value) of 0.42 at a wavelength of 193 nm.

Also, foreign-matter removing coating films were formed in substantially the same manner as described above except that the baking temperature was changed to 190° C., 210° C., or 220° C. It was found that these foreign-matter removing coating films were insoluble in ethyl lactate and propylene glycol monomethyl ether acetate.

Then, a dissolution rate of the foreign-matter removing coating film in a developer (trade name NMD-3, manufactured by Tokyo Ohka Kogyo Co., Ltd.) was determined using a resist development analyzer (manufactured by Litho Tech Japan Co., Ltd.). The temperature of the atmosphere surrounding the analyzer was 25° C. The foreign-matter removing coating film formed at a baking temperature of 190° C. for a baking time of 60 seconds had a dissolution rate of 9.7 nm per second. The foreign-matter removing coating film formed at a baking temperature of 200° C. for a baking time of 60 seconds had a dissolution rate of 0.55 nm per second, the foreign-matter removing coating film formed at a baking temperature of 210° C. for a baking time of 60 seconds had a dissolution rate of 0.37 nm per second, and the foreign-matter removing coating film formed at a baking temperature of 220° C. for a baking time of 60 seconds had a dissolution rate of 0.13 nm per second.

In other words, the foreign-matter removing coating film formed at a baking temperature of 190° C. for a baking time of 60 seconds can be completely removed in about 4.1 seconds, the foreign-matter removing coating film formed at a baking temperature of 200° C. for a baking time of 60 seconds can be completely removed in about 72.7 seconds, the foreign-matter removing coating film formed at a baking temperature of 210° C. for a baking time of 60 seconds can be completely removed in about 108.1 seconds, and the foreign-matter removing coating film formed at a baking temperature of 220° C. for a baking time of 60 seconds can be completely removed in about 307.7 seconds. Therefore, the foreign matter present on the above foreign-matter removing coating film can also be removed.

The solution [4] of foreign-matter removing coating film forming composition was applied onto a silicon wafer substrate using a spinner, and then baked on a hotplate at 210° C. for 60 seconds to form a foreign matter removing coating film having a thickness of 40 nm. A positive photoresist film for KrF was formed on the obtained foreign-matter removing coating film, and subjected to exposure using a KrF excimer laser (wavelength: 248 nm) through a mask, which was set so as to form a 200 nm line and space (L/S) pattern.

The resultant film was subjected to post exposure baking at 110° C. for 90 seconds, and then subjected to puddle development using a 2.38% aqueous solution of tetramethylammonium hydroxide (trade name NMD-3, manufactured by Tokyo Ohka Kogyo Co., Ltd.) as a developer for photoresist for 60 seconds. The exposed region of both the photoresist and the foreign-matter removing coating film was dissolved, and no residual film was seen even at the 200 nm line and space (L/S).

Example 5

(Synthesis of a Polyamic Acid)

17.8 g of 4,4'-(hexafluoroisopropylidene)diphthalic dianhydride, 3.12 g of 3,5-diaminobenzoic acid, and 4.92 g of bis(4-aminophenyl sulfone) were reacted in 145.6 g of propylene glycol monomethyl ether at 80° C. for 20 hours to obtain a solution [C] containing a polyamic acid. GPC analysis of the obtained polyamic acid showed that the weight average molecular weight Mw was 8,600 (determined using a conversion calibration curve obtained from the standard polystyrene), and the number average molecular weight Mn was 5,200.

(Preparation of Foreign Matter Removing Coating Film Forming Composition)

To 25.0 g of the solution [C] containing a polyamic acid were added 4.15 g of the light absorbing compound solution [a], 1.13 g of 4,4'-methylenebis(N,N-diglycidylaniline), 0.825 g of 3,7-dihydroxynaphthoic acid, 0.124 g of triphenylsulfonium trifluoromethanesulfonate, 82.8 g of propylene glycol monomethyl ether, 127 g of propylene glycol monomethyl ether acetate, and 10.0 g of cyclohexanone, and the resultant mixture was stirred at room temperature for 30 minutes to prepare a solution [5] of foreign-matter removing coating film forming composition.

(Evaluation of the Foreign-Matter Removing Coating Film Forming Composition)

The solution [5] of foreign-matter removing coating film forming composition was applied onto a silicon wafer substrate using a spinner, and then baked on a hotplate at 175° C. for 60 seconds to form a foreign matter removing coating film having a thickness of 40 nm. The obtained foreign-matter removing coating film was insoluble in propylene glycol, ethyl lactate, and propylene glycol monomethyl ether acetate. Measurement of the foreign-matter removing coating film using an ellipsometer showed that the film had a refractive index (n value) of 1.80 and an attenuation coefficient (k value) of 0.44 at a wavelength of 248 nm, and had a refractive index (n value) of 1.50 and an attenuation coefficient (k value) of 0.44 at a wavelength of 193 nm.

Also, foreign-matter removing coating films were formed in substantially the same manner as described above except that the baking temperature was changed to 170° C. or 180° C. It was found that these foreign-matter removing coating films were insoluble in ethyl lactate and propylene glycol monomethyl ether acetate.

Then, a dissolution rate of the foreign-matter removing coating film in a developer (trade name NMD-3, manufactured by Tokyo Ohka Kogyo Co., Ltd.) was determined using a resist development analyzer (manufactured by Litho Tech Japan Co., Ltd.). The temperature of the atmosphere surrounding the analyzer was 25° C. The foreign-matter removing coating film formed at a baking temperature of 170° C. for a baking time of 60 seconds had a dissolution rate of 2.35 nm per second, and the foreign-matter removing coating film formed at a baking temperature of 175° C. for a baking time of 60 seconds had a dissolution rate of 2.00 nm per second. The foreign-matter removing coating film formed at a baking temperature of 180° C. for a baking time of 60 seconds had a dissolution rate of 1.82 nm per second.

In other words, the foreign-matter removing coating film formed at a baking temperature of 170° C. for a baking time of 60 seconds can be completely removed in 17 seconds, the foreign-matter removing coating film formed at a baking temperature of 175° C. for a baking time of 60 seconds can be completely removed in 20 seconds, and the foreign-matter removing coating film formed at a baking temperature of 180° C. for a baking time of 60 seconds can be completely removed in 22 seconds. Therefore, the foreign matter present on the above foreign-matter removing coating film can also be removed.

The solution [5] of foreign-matter removing coating film forming composition was applied onto a silicon wafer substrate using a spinner, and then baked on a hotplate at 220° C. for 60 seconds to form a foreign matter removing coating film having a thickness of 40 nm. A positive photoresist film for KrF was formed on the obtained foreign-matter removing coating film, and subjected to exposure using a KrF excimer laser (wavelength: 248 nm) through a mask, which was set so as to form a 200 nm line and space (L/S) pattern. The resultant film was subjected to post exposure baking at 110° C. for 90 seconds, and then subjected to puddle development using a 2.38% aqueous solution of tetramethylammonium hydroxide (trade name NMD-3, manufactured by Tokyo Ohka Kogyo Co., Ltd.) as a developer for photoresist for 60 seconds. The exposed region of both the photoresist and the foreign-matter removing coating film was dissolved, and no residual film was seen even at the 200 nm line and space (L/S).

Comparative Example 1

(Synthesis of a Polyamic Acid)

4.36 g of pyromellitic dianhydride, 0.838 g of p-phenylenediamine, and 4.26 g of 2,2-bis(3-amino-4-tolyl) hexafluoropropane were reacted in 55.6 g of propylene glycol monomethyl ether at 60° C. for 25 hours to obtain a polyamic acid solution [D]. GPC analysis of the obtained polyamic acid showed that the weight average molecular weight Mw was 8,600 (determined using a conversion calibration curve obtained from the standard polystyrene), and the number average molecular weight Mn was 4,800.

(Preparation of Foreign Matter Removing Coating Film Forming Composition)

To 14.0 g of the polyamic acid solution [D] were added 4.38 g of the light absorbing compound solution [a] used in Example 1, 0.630 g of tris(2,3-epoxypropyl) isocyanurate, 52.3 g of propylene glycol monomethyl ether, and 67.5 g of propylene glycol monomethyl ether acetate, and the resultant mixture was stirred at room temperature for 30 minutes to prepare a solution [6] of foreign-matter removing coating film forming composition.

(Evaluation of the Foreign-Matter Removing Coating Film Forming Composition)

The solution [6] of foreign-matter removing coating film forming composition was applied onto a silicon wafer substrate using a spinner, and then baked on a hotplate at 200° C. for 60 seconds to form a foreign matter removing coating film having a thickness of 40 nm. The obtained foreign-matter removing coating film was insoluble in ethyl lactate and propylene glycol monomethyl ether acetate. Measurement of the foreign-matter removing coating film using an ellipsometer showed that the film had a refractive index (n value) of 1.68 and an attenuation coefficient (k value) of 0.40 at a wavelength of 248 inn, and had a refractive index (n value) of 1.53 and an attenuation coefficient (k value) of 0.42 at a wavelength of 193 nm.

The foreign-matter removing coating film formed from the solution [6] of foreign-matter removing coating film forming composition was insoluble in a 2.38% aqueous solution of tetramethylammonium hydroxide (trade name NMD-3, manufactured by Tokyo Ohka Kogyo Co., Ltd.).

(Evaluation of the Effect when the Formed Film is Allowed to Stand)

The solution [5] of foreign-matter removing coating film forming composition was applied onto a silicon wafer substrate using a spinner, and then baked on a hotplate at 160° C., 175° C., or 190° C. for 60 seconds to form a foreign matter removing coating film having a thickness of 40 nm. Each of the wafer immediately after forming the film, and wafers allowed to stand in a wafer case for 1 day, 3 days, or 7 days was subjected to puddle development using a 2.38% aqueous solution of tetramethylammonium hydroxide (trade name NMD-3, manufactured by Tokyo Ohka Kogyo Co., Ltd.) for 60 seconds. On the wafer surface on which the film had been formed, the film thickness was measured using an ellipsometer. The results that the residual film had a thickness of 1 nm or less in all the above conditions revealed that even the film formed and allowed to stand for 7 days had the similar film removing properties as did the film immediately after the formation.

INDUSTRIAL APPLICABILITY

The present invention is directed to a composition for forming a coating film for removing foreign matters, a method for removing foreign matters on a substrate, a method for treating a substrate, and a method for producing a laminated substrate, which are advantageous in that foreign matters formed on a substrate can be removed by a simple and easy method. There can be provided a composition for forming a coating film for removing foreign matters, which is preferably used in the semiconductor wafer temporarily bonding step in the production of a semiconductor device.

The invention claimed is:

1. A method for removing foreign matters, comprising the steps of:
    applying a composition for forming a coating film for removing foreign matters, comprising a polymer and a solvent, onto a substrate and baking the applied composition to form a coating film that is soluble in a developer and has a thickness of 5 nm to 1 µm;
    allowing foreign matters to form on the coating film; and
    removing the coating film together with the foreign matters using the developer.

2. The method according to claim 1, wherein the step of allowing foreign matters to form includes the step of forming a bonding layer on the coating film, and the step of peeling the bonding layer off thereafter.

3. The method according to claim 2, wherein the foreign matters are a peeling residue of the bonding layer.

4. The method according to claim 1, wherein the polymer is a polyamic acid having a structural unit derived from (a) a tetracarboxylic dianhydride compound and (b) a diamine compound having at least one carboxyl group.

5. The method according to claim 1, wherein the polymer is a polyamic acid having
    a structural unit derived from (a) a tetracarboxylic dianhydride compound and (b) a diamine compound having at least one carboxyl group, and
    a structural unit derived from the (a) tetracarboxylic dianhydride compound and (c) a diamine compound different from the diamine compound (b).

6. The method according to claim 5, wherein the diamine compound (c) is a diamine compound having no carboxyl group.

7. A method for treating a substrate, comprising the steps of:
    applying a composition for forming a coating film for removing foreign matters, comprising a polymer and a solvent, onto a first substrate and baking the applied composition to form a coating film that is soluble in a developer and has a thickness of 5 nm to 1 µm;
    forming a bonding layer on the coating film;
    temporarily bonding a second substrate to the first substrate through the bonding layer;
    peeling the second substrate off from the first substrate; and
    removing the coating film remaining on the first substrate after the peeling of the second substrate, together with the bonding layer, using the developer.

8. The method according to claim 7, wherein the polymer is a polyamic acid having a structural unit derived from (a) a tetracarboxylic dianhydride compound and (b) a diamine compound having at least one carboxyl group.

9. The method according to claim 7, wherein the polymer is a polyamic acid having
    a structural unit derived from (a) a tetracarboxylic dianhydride compound and (b) a diamine compound having at least one carboxyl group, and
    a structural unit derived from the (a) tetracarboxylic dianhydride compound and (c) a diamine compound different from the diamine compound (b).

10. The method according to claim 9, wherein the diamine compound (c) is a diamine compound having no carboxyl group.

11. A method for producing a laminated substrate, comprising the steps of:
    applying a composition for forming a coating film for removing foreign matters, comprising a polymer and a solvent, onto a first substrate and baking the applied composition to form a coating film that is soluble in a developer and has a thickness of 5 nm to 1 µm;
    forming a bonding layer on the coating film; and
    bonding a second substrate to the first substrate.

12. The method according to claim 11, wherein the polymer is a polyamic acid having a structural unit derived from (a) a tetracarboxylic dianhydride compound and (b) a diamine compound having at least one carboxyl group.

13. The method according to claim 11, wherein the polymer is a polyamic acid having
    a structural unit derived from (a) a tetracarboxylic dianhydride compound and (b) a diamine compound having at least one carboxyl group, and
    a structural unit derived from the (a) tetracarboxylic dianhydride compound and (c) a diamine compound different from the diamine compound (b).

14. The method according to claim 13, wherein the diamine compound (c) is a diamine compound having no carboxyl group.

* * * * *